(12) United States Patent
Yong et al.

(10) Patent No.: US 11,178,768 B2
(45) Date of Patent: Nov. 16, 2021

(54) FLEXIBLE PRINTED CIRCUIT EMI ENCLOSURE

(71) Applicant: Intel Corporation, Santa Clara, CA (US)

(72) Inventors: Khang Choong Yong, Puchong (MY); Stephen H. Hall, Forest Grove, OR (US); Tin Poay Chuah, Bayan Lepas (MY); Boon Ping Koh, Seberang Jaya (MY); Eng Huat Goh, Penang (MY)

(73) Assignee: Intel Corporation, Santa Clara, CA (US)

( * ) Notice: Subject to any disclaimer, the term of this patent is extended or adjusted under 35 U.S.C. 154(b) by 1159 days.

(21) Appl. No.: 15/089,303

(22) Filed: Apr. 1, 2016

(65) Prior Publication Data

US 2017/0290154 A1 Oct. 5, 2017

(51) Int. Cl.
*H05K 1/18* (2006.01)
*H05K 1/14* (2006.01)
(Continued)

(52) U.S. Cl.
CPC .......... *H05K 1/147* (2013.01); *G06K 9/0002* (2013.01); *H01L 25/18* (2013.01); *H05K 1/0218* (2013.01);
(Continued)

(58) Field of Classification Search
CPC .... H05K 1/0277; H05K 1/028; H05K 1/0283; H05K 1/147; H05K 1/189;
(Continued)

(56) References Cited

U.S. PATENT DOCUMENTS 7,639,513 B2 * 12/2009 Otsuki ............... H01L 23/5387
361/760
7,999,633 B2 8/2011 Xu et al.
(Continued)

FOREIGN PATENT DOCUMENTS

JP 05243775 9/1993
JP 09312454 12/1997
(Continued)

OTHER PUBLICATIONS

De Jong, Erik C.W., et al., "Toward the Next Level of PCB Usage in Power Electronic Converters", IEEE Transactions on Power Electronics, 23(6), (Nov. 2008), 3151-3162.
(Continued)

*Primary Examiner* — Binh B Tran
(74) *Attorney, Agent, or Firm* — Schwegman Lundberg & Woessner, P.A.

(57) ABSTRACT

Three-dimensional (3-D) volumetric board architectural design provides technical solutions to technical problems facing miniaturization of circuit boards. The 3-D volumetric architecture includes using more of the unused volume in the vertical dimension (e.g., Z-dimension) to increase the utilization of the total circuit board volume. The 3-D volumetric architecture is realized by mounting components on a first PCB and on a second PCB, and inverting and suspending the second PCB above the first PCB. The use of 3-D volumetric board architectural design further enables formation of a shielded FEMIE, providing shielding and improved volumetric use with little or no reduction in system performance or increase in system Z-height.

22 Claims, 21 Drawing Sheets

(51) Int. Cl.
*H01L 25/18* (2006.01)
*G06K 9/00* (2006.01)
*H05K 1/02* (2006.01)
*H05K 9/00* (2006.01)
*H05K 3/36* (2006.01)

(52) U.S. Cl.
CPC .......... *H05K 1/181* (2013.01); *H05K 9/0024* (2013.01); *H05K 3/363* (2013.01); *H05K 2201/047* (2013.01); *H05K 2201/056* (2013.01); *H05K 2201/10159* (2013.01)

(58) Field of Classification Search
CPC ...... H05K 2201/05; H05K 1/11; H05K 1/118; H05K 2201/09445; H05K 2201/09736; H05K 1/0218; H05K 1/0393; H05K 1/0224; H05K 9/0022; H05K 9/0024; H05K 9/0052; H05K 9/0071; H05K 9/0081; H05K 9/0098; H05K 2201/0707; H05K 2201/10371
USPC .................... 361/749–753, 757, 816–818
See application file for complete search history.

(56) References Cited

U.S. PATENT DOCUMENTS

| | | | |
|---|---|---|---|
| 8,987,872 B2* | 3/2015 | Hwang | H01L 23/552 257/659 |
| 2009/0135573 A1* | 5/2009 | Sato | H05K 1/144 361/803 |
| 2012/0147571 A1* | 6/2012 | Just | H05K 1/0218 361/750 |
| 2013/0094155 A1* | 4/2013 | Lo | H05K 1/147 361/735 |
| 2014/0098501 A1 | 4/2014 | Kawaguchi et al. | |
| 2015/0022986 A1* | 1/2015 | Steuer | H05K 9/0022 361/767 |

FOREIGN PATENT DOCUMENTS

| | | |
|---|---|---|
| JP | 2000049439 | 2/2000 |
| JP | 2001102712 | 4/2001 |
| WO | WO-2009114225 A1 | 9/2009 |
| WO | 2017172203 | 10/2017 |

OTHER PUBLICATIONS

"International Application Serial No. PCT US2017 020147, International Preliminary Report on Patentability dated Oct. 11, 2018", 8 pgs.

"International Application Serial No. PCT US2017 020147, Written Opinion dated May 18, 2017", 6 pgs.

"International Application Serial No. PCT US2017 020147, International Search Report dated May 18, 2017", 3 pgs.

* cited by examiner

FLEXIBLE PRINTED CIRCUIT EMI ENCLOSURE

TECHNICAL FIELD

Embodiments described herein generally relate to reducing printed circuit board footprint while providing electromagnetic interference (EMI) shielding.

BACKGROUND

There is an increasing demand for mobile electronic devices and device-to-device communication (e.g., Internet of Things or "IoT"). Reduction of the size of the circuit board enables reduced electronic device size, which is especially desirable in portable or wearable electronic devices. However, existing printed circuit boards (PCB) and system-in-package design places limits on how much further the circuit board size can be miniaturized.

Existing solutions for reducing circuit board size include increasing the number of circuit board layers, such as using use double-sided boards or stacking multiple PCBs. However, these solutions all increase the vertical height (e.g., Z-height), reduce system performance by requiring additional connections, and reduce testability during or following manufacturing. Another solution for reducing circuit board size includes embedding discrete components into the circuit board, however this also reduces access to the component and further hinders testability. Another solution includes reducing the number of electronic components (e.g., integrated circuit (IC) die), however this reduces the number of available features.

It is desirable to reduce the size of circuit boards while maintaining desired circuit board reliability and testability.

DESCRIPTION OF EMBODIMENTS

Three-dimensional (3-D) volumetric board architectural design provides technical solutions to technical problems facing miniaturization of circuit boards. The 3-D volumetric architecture includes using more of the unused volume in the vertical dimension (e.g., Z-dimension) to increase the utilization of the total circuit board volume. The 3-D volumetric architecture is realized by mounting electronic components (e.g., dies, processors, memory, etc.) on a first PCB and on a second PCB, and inverting and suspending the second PCB above the first PCB. In an example, the second PCB is realized using a shielded flexible PCB (FPC) electromagnetic interference (EMI) enclosure, where this FEMIE can be used to replace existing a conventional EMI shielding container. This FEMIE augments a conventional EMI shielding container functionality with additional interconnect capability, thus allowing additional signal routings or electronic components previously on the circuit substrate (e.g., integrated circuit (IC) package, base circuit board) to be transferred to the FEMIE. The use of FPC technology provides significant control over PCB layer stacking and layer bending radius, allowing significant control and flexibility in designing the FEMIE. In an example, the shielded FEMIE is formed using the dimensions of a conventional EMI shielding containers, thereby reducing the amount of redesign when replacing a conventional EMI shielding container with the shielded FEMIE.

The use of 3-D volumetric board architectural design enables a reduction of the circuit board size without a significant increase in overall system Z-height, while maintaining testability during or following manufacturing. For example, this volumetric design may reduce the size of a system-in-package (SiP) component without increasing Z-height, or may reduce the footprint of a group of PCB components, thereby providing additional PCB space to simplify system-level design, to provide area for additional components, and to increase battery footprint. The use of 3-D volumetric board architectural design further enables formation of a shielded FEMIE, providing shielding and improved volumetric use with little or no reduction in system performance or increase in system Z-height.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
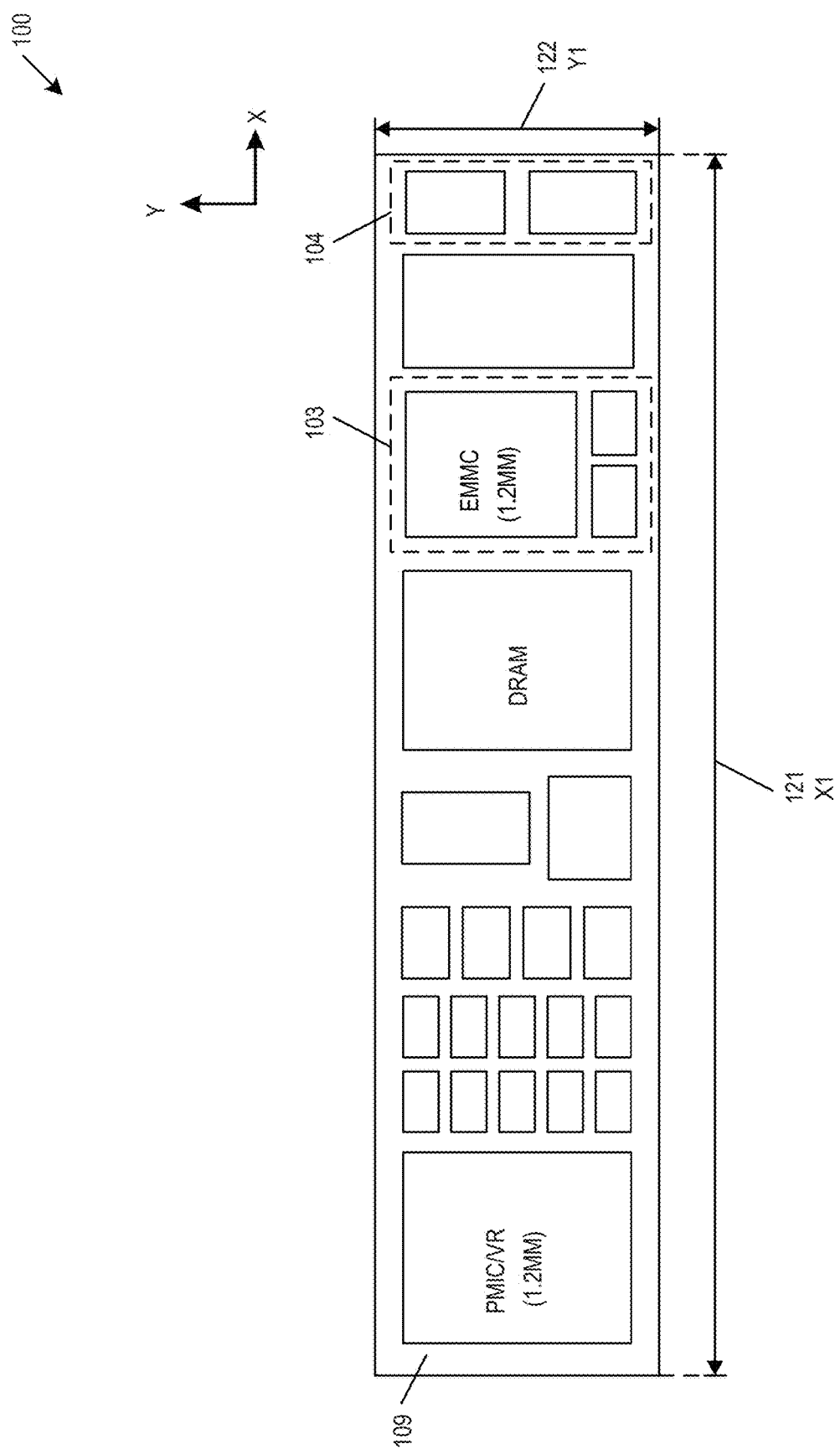
FIG. 1 is a top view of a 2-D PCB design, in accordance with at least one embodiment of the invention.
Figure 3:
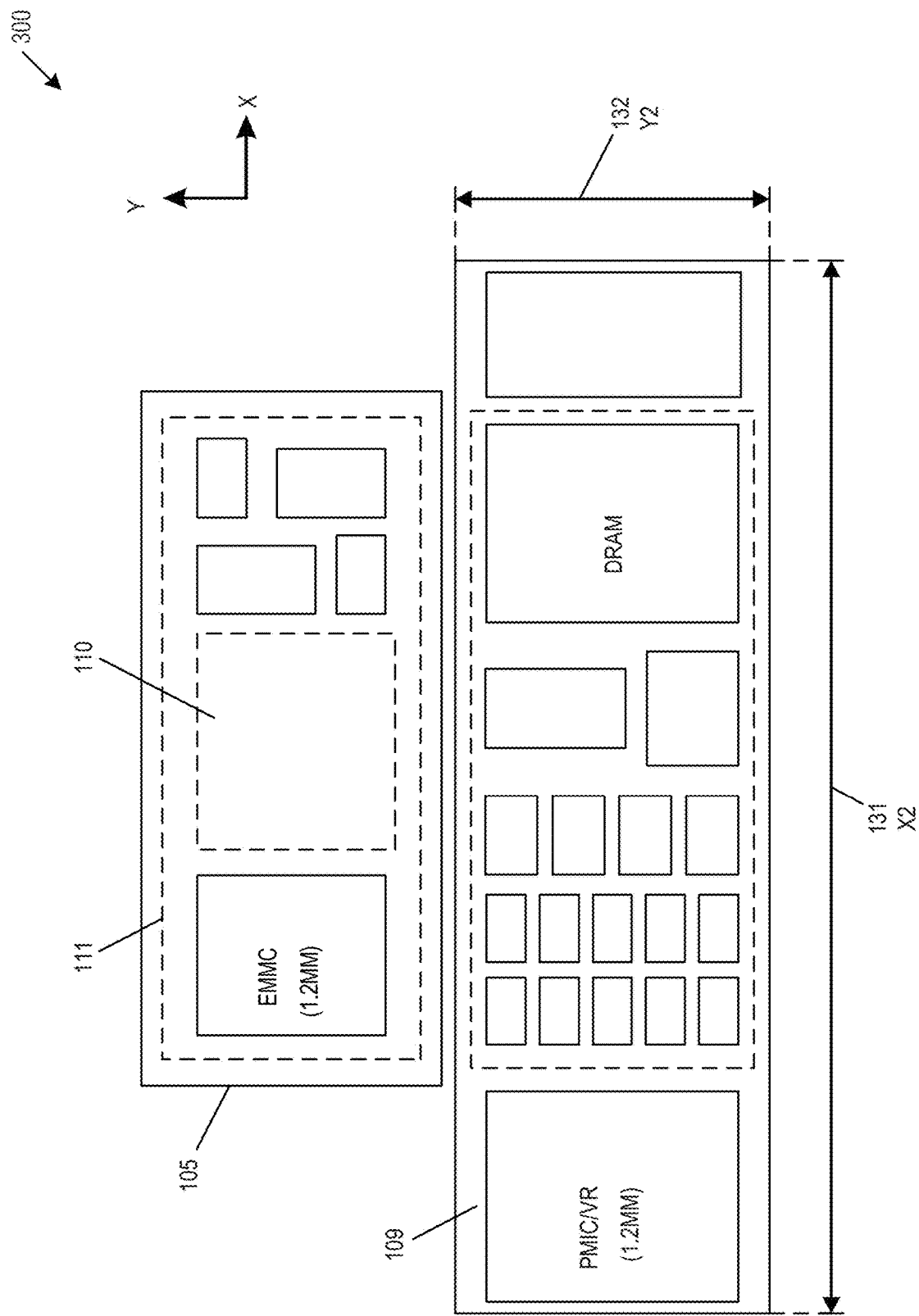
FIG. 3 is a top view of a 3-D PCB design, in accordance with at least one embodiment of the invention.
Figure 4:
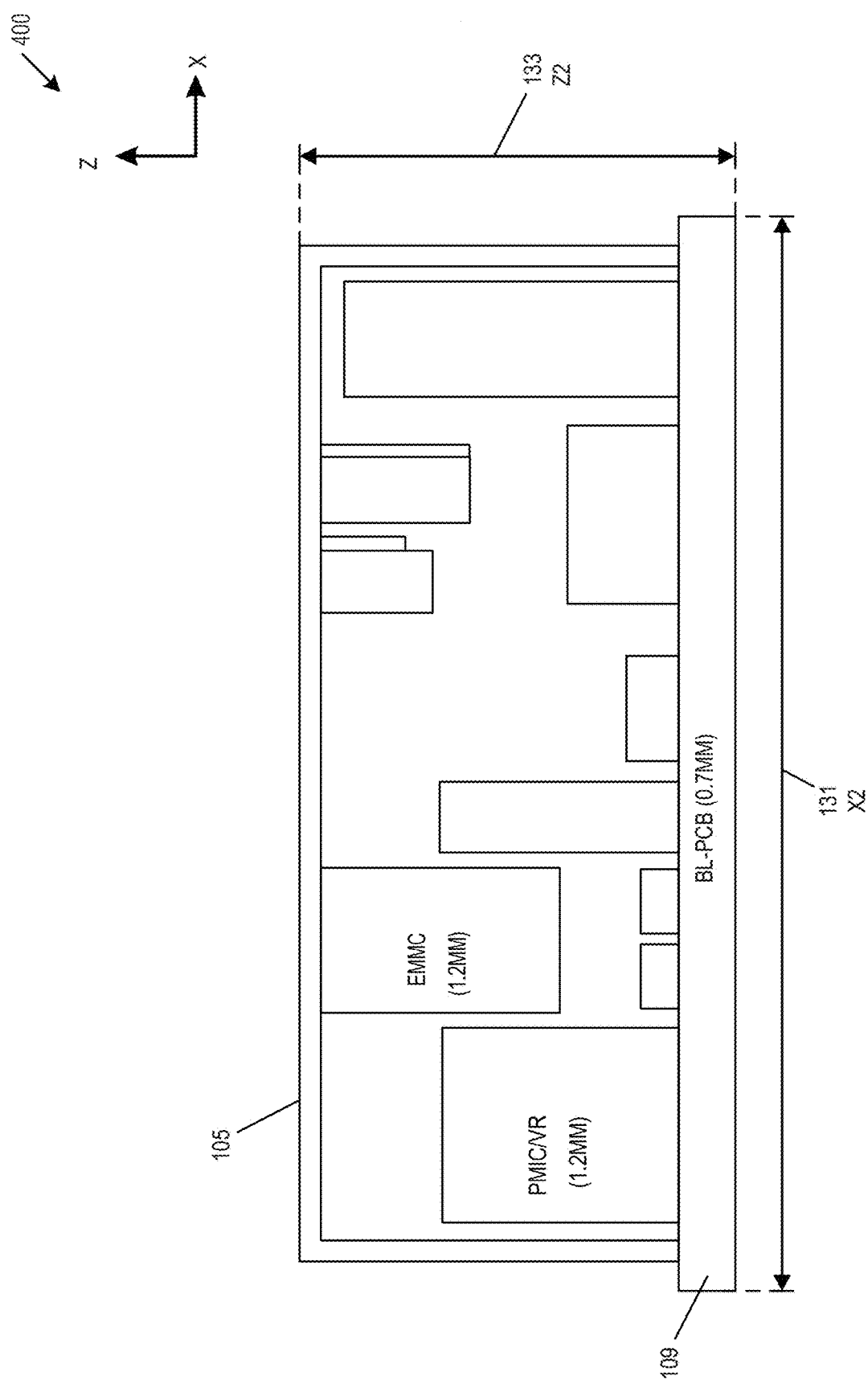
FIG. 4 is a side view of the 3-D PCB design, in accordance with at least one embodiment of the invention.

FIG. 1 is a top view of a 2-D PCB design 100, in accordance with at least one embodiment of the invention. Design 100 includes a base PCB 109 with various surface-mounted technology (SMT) electronic components. Though design 100 includes a base PCB, other types of circuit substrates may be used, such as an integrated circuit (IC) package or other substrate. Design 109 has an associated X1 width 121 and an associated Y1 depth 122, which may be reduced by relocating groups of components 103 and 104 using a 3-D volumetric architecture, such as shown in FIGS. 3-4. The Z-height required by various SMT components on base PCB 109 results in unused volume, such as shown in FIG. 2.

Figure 2:
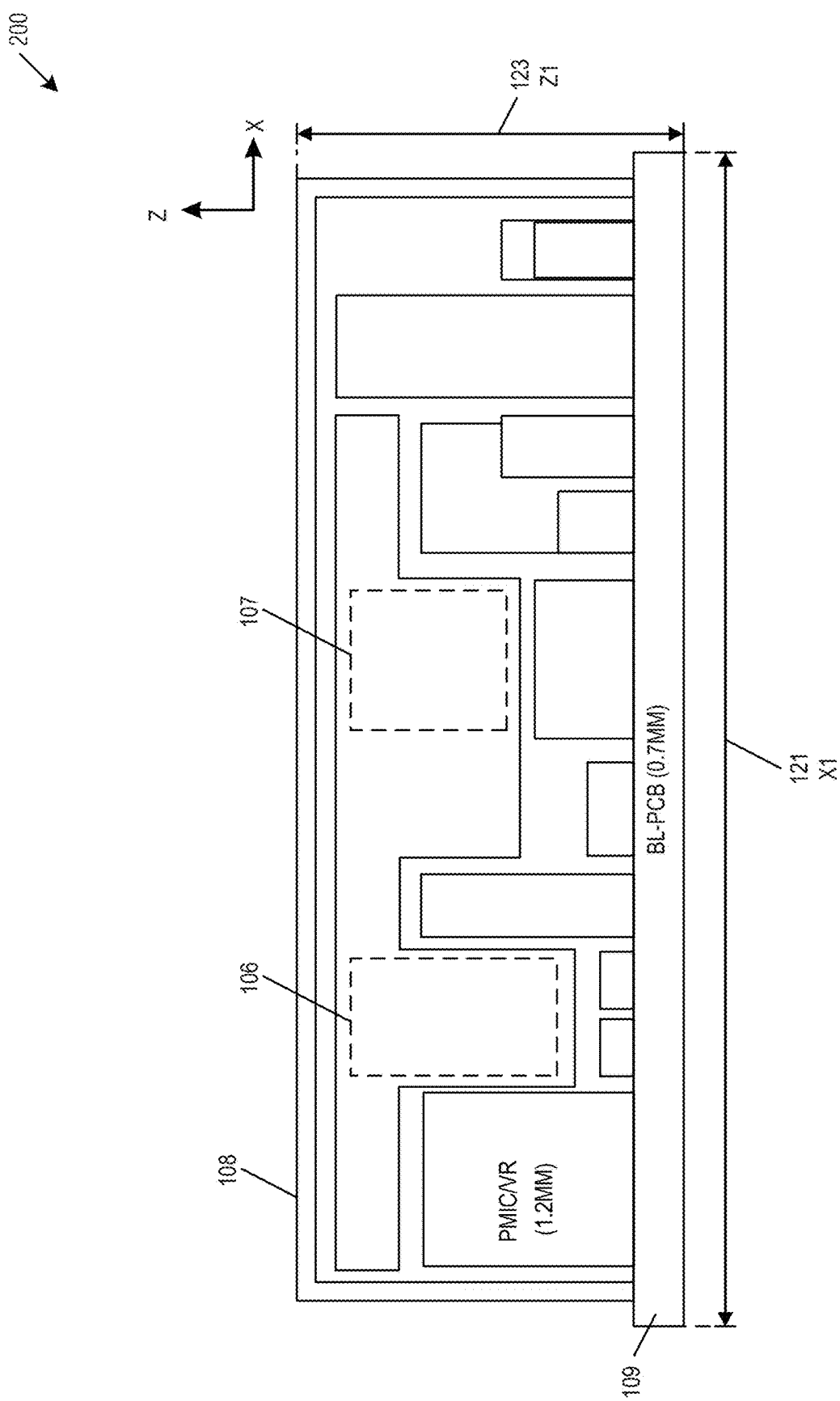
FIG. 2 is a side view of the 2-D PCB design, in accordance with at least one embodiment of the invention.

FIG. 2 is a side view of the 2-D PCB design 200, in accordance with at least one embodiment of the invention. Design 200 shows the base PCB 109 with the Z-height required by various SMT components on base PCB 109. An EMI shield 108 is placed on base PCB 109 over the SMT components, where the base PCB 109 and shield 108 have an associated Z1 height 123. The Z-height required by various SMT components leaves considerable unused volume within EMI shield 108, such as volume 106 and volume 107.

Figure 10:
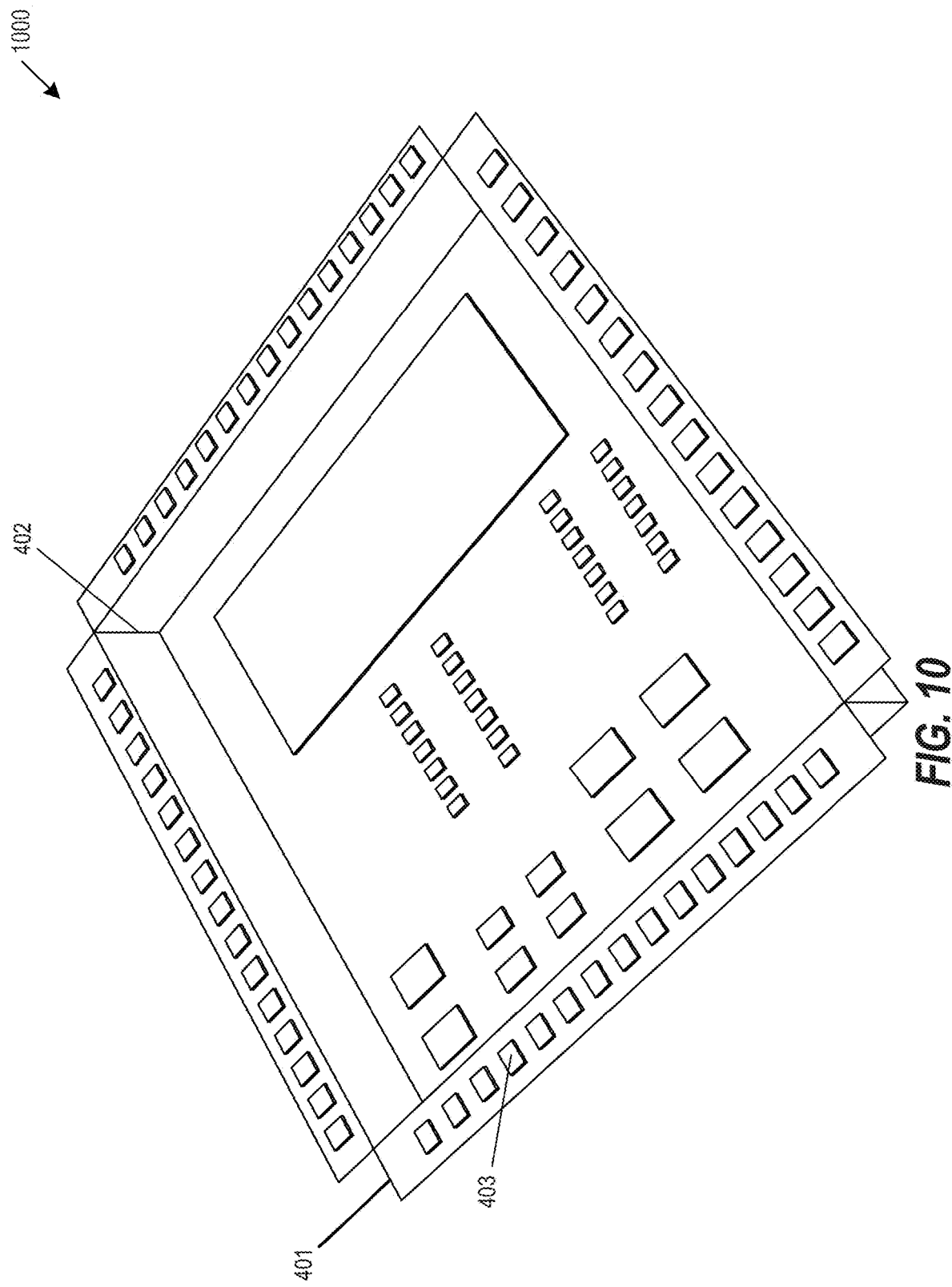
FIG. 10 is a bottom perspective view of a shielded FEMIE, in accordance with at least one embodiment of the invention.

FIG. 3 is a top view of a 3-D PCB design 300, in accordance with at least one embodiment of the invention. Design 109 has an associated X2 width 131 and an associated Y2 depth 132. Design 300 shows the effects of relocating components to the shielded FEMIE 105. In particular, groups of components 103 and 104 are transferred from base PCB 109 to shielded FEMIE 105. The components 103 and 104 are then rearranged on the shielded FEMIE 105 to accommodate the Z-height required by SMT components remaining on base PCB 109. In an example, signal routings on base PCB 109 are transferred to signal routing area 110 on the shielded FEMIE 105 to mitigate congested signal routing and improve signal integrity. The shielded FEMIE 105 includes signal routing through the side walls of the shielded FEMIE 105 to contact pads 111 on the bottom of the side walls, such as shown in FIG. 10. The resulting 3-D volumetric board architectural design is shown in FIG. 4.

FIG. 4 is a side view of the 3-D PCB design 400, in accordance with at least one embodiment of the invention. Design 400 shows the fabricated shielded FEMIE 105 placed on base PCB 109, resulting in an increased volumetric efficiency. In the examples shown in FIGS. 1-4, for a given depth and height, the X1 width 121 may be reduced to the X2 width 131. In an example, this may result in an area reduction of 400 mm$^2$ or more.

Figure 5:
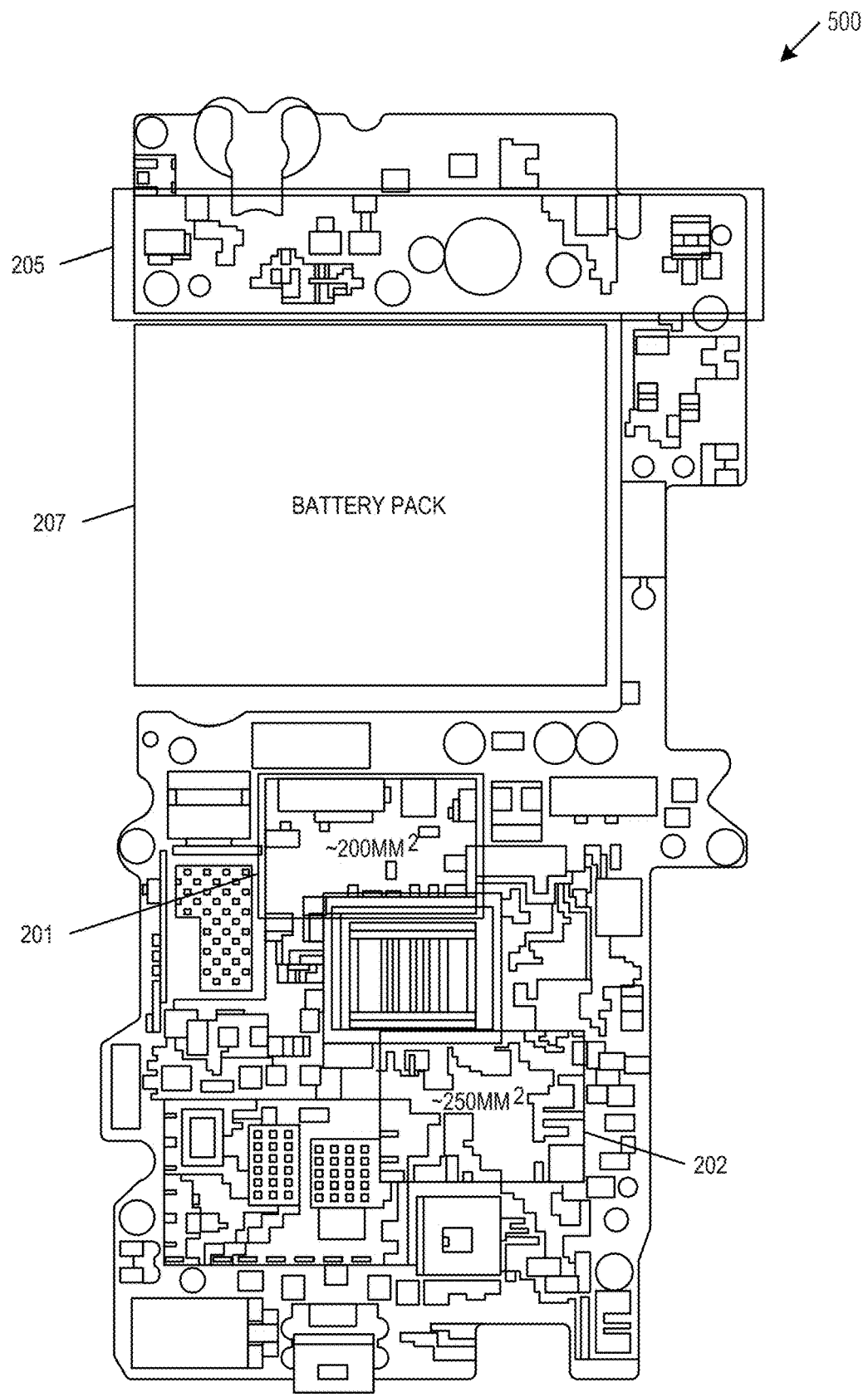
FIG. 5 is a top view of a first manufactured PCB, in accordance with at least one embodiment of the invention.

FIG. 5 is a top view of a first manufactured PCB 500, in accordance with at least one embodiment of the invention. PCB 500 includes a group of components 205 that may be relocated to a FEMIE. PCB 500 includes a first area 201 of approximately 200 mm$^2$ and a second area 202 of approximately 250 mm$^2$ that include few or no components. In an example, the first and second areas 201 and 202 include multiple signal lines within the PCB 500, preventing placement of SMT components. By relocating components 205 to a FEMIE above the unused first and second areas 201 and 202, the battery pack footprint 207 may be increased, or additional components may be placed in the area currently occupied by components 205. Due to the spatial separation between first and second areas 201 and 202, components 205 may be relocated to one, two, or more FEMIEs above the unused first and second areas 201 and 202

Figure 6:
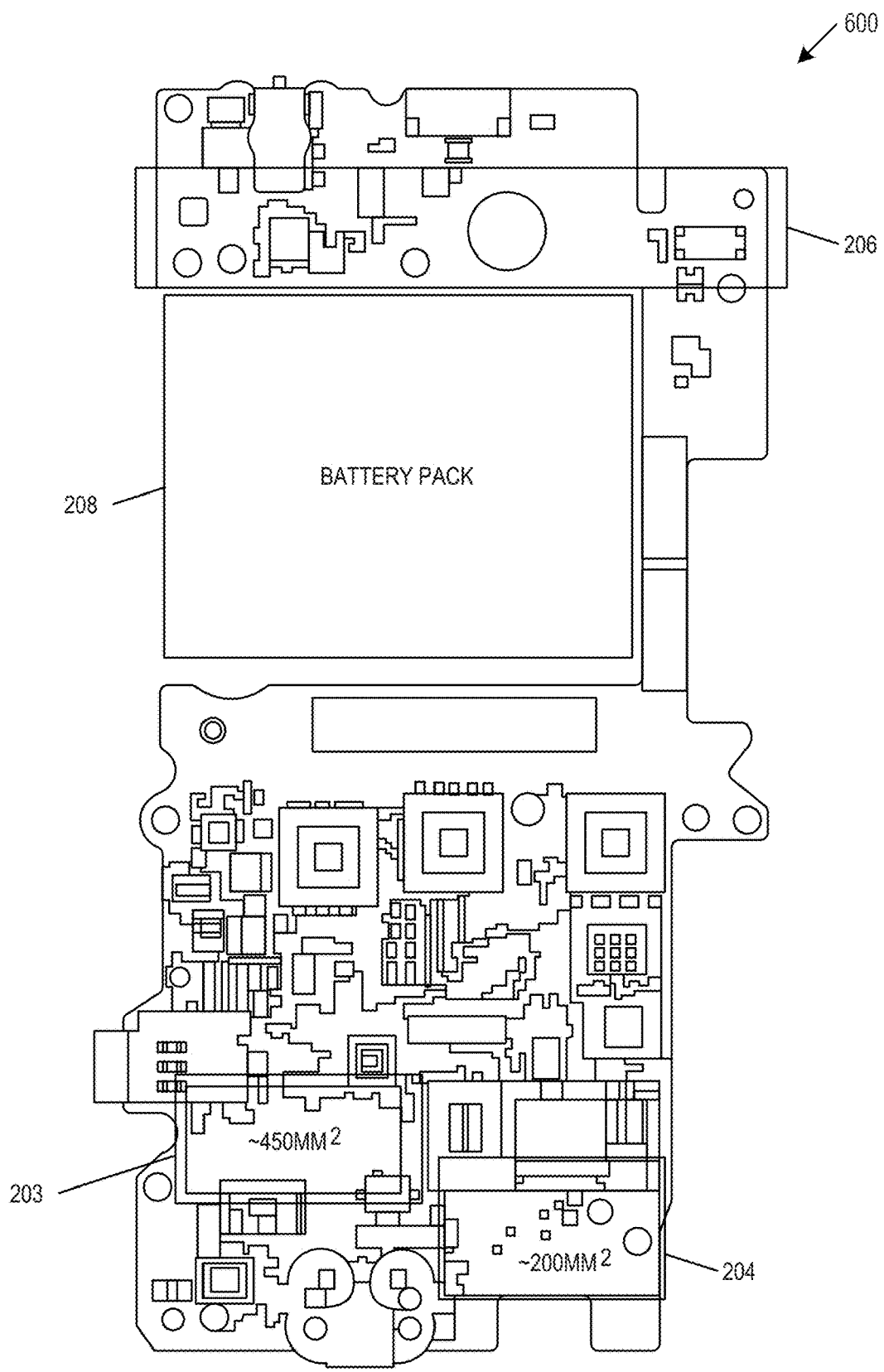
FIG. 6 is a top view of a second manufactured PCB, in accordance with at least one embodiment of the invention.

FIG. 6 is a top view of a second manufactured PCB 600, in accordance with at least one embodiment of the invention. PCB 600 also includes a group of components 206 that may be relocated to a FEMIE above the unused first area 203 of approximately 450 mm$^2$ and second area 204 of approximately 200 mm$^2$. This also allows an increase in the battery pack footprint 208 or placement of additional components in the area currently occupied by components 206. Due to the proximity of first and second areas 203 and 204, components 205 may be relocated to a single shared FEMIE above the unused first and second areas 203 and 204.

Figure 7:
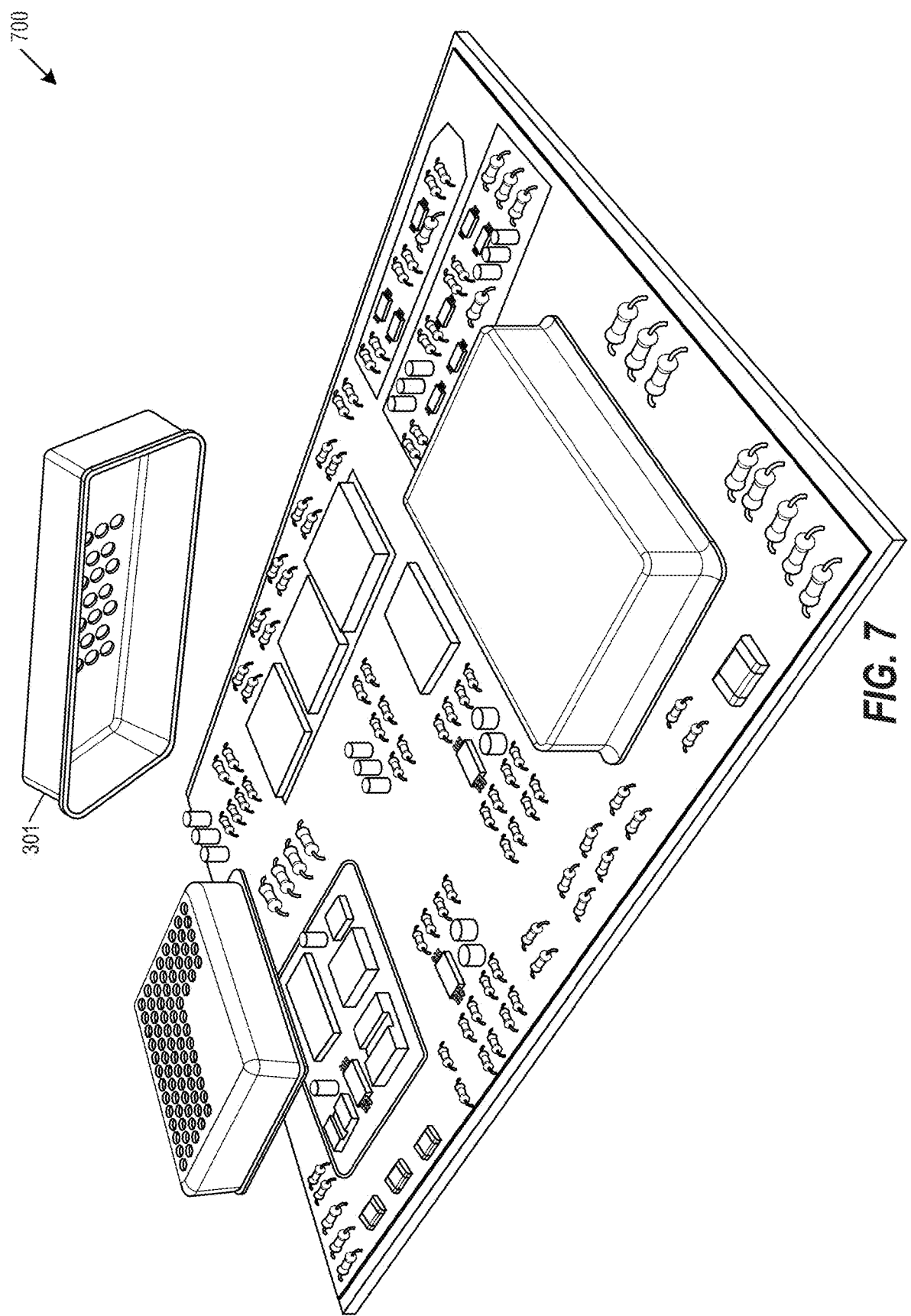
FIG. 7 is a perspective view of a one-piece EMI shield design, in accordance with at least one embodiment of the invention.

FIG. 7 is a perspective view of a one-piece EMI shield design 700, in accordance with at least one embodiment of the invention. Design 700 includes a one-piece standalone EMI enclosure 301. Various components from the existing design 700 are moved to a FEMIE, and the FEMIE is used to replace the one-piece EMI enclosure 301. In an example, the replacement FEMIE is shaped similar to one-piece EMI enclosure 301, simplifying board redesign. In another example, the replacement FEMIE is designed to cover all components in design 700, allowing more components to be moved to the FEMIE, and allowing a reduction in the footprint of design 700.

Figure 8:
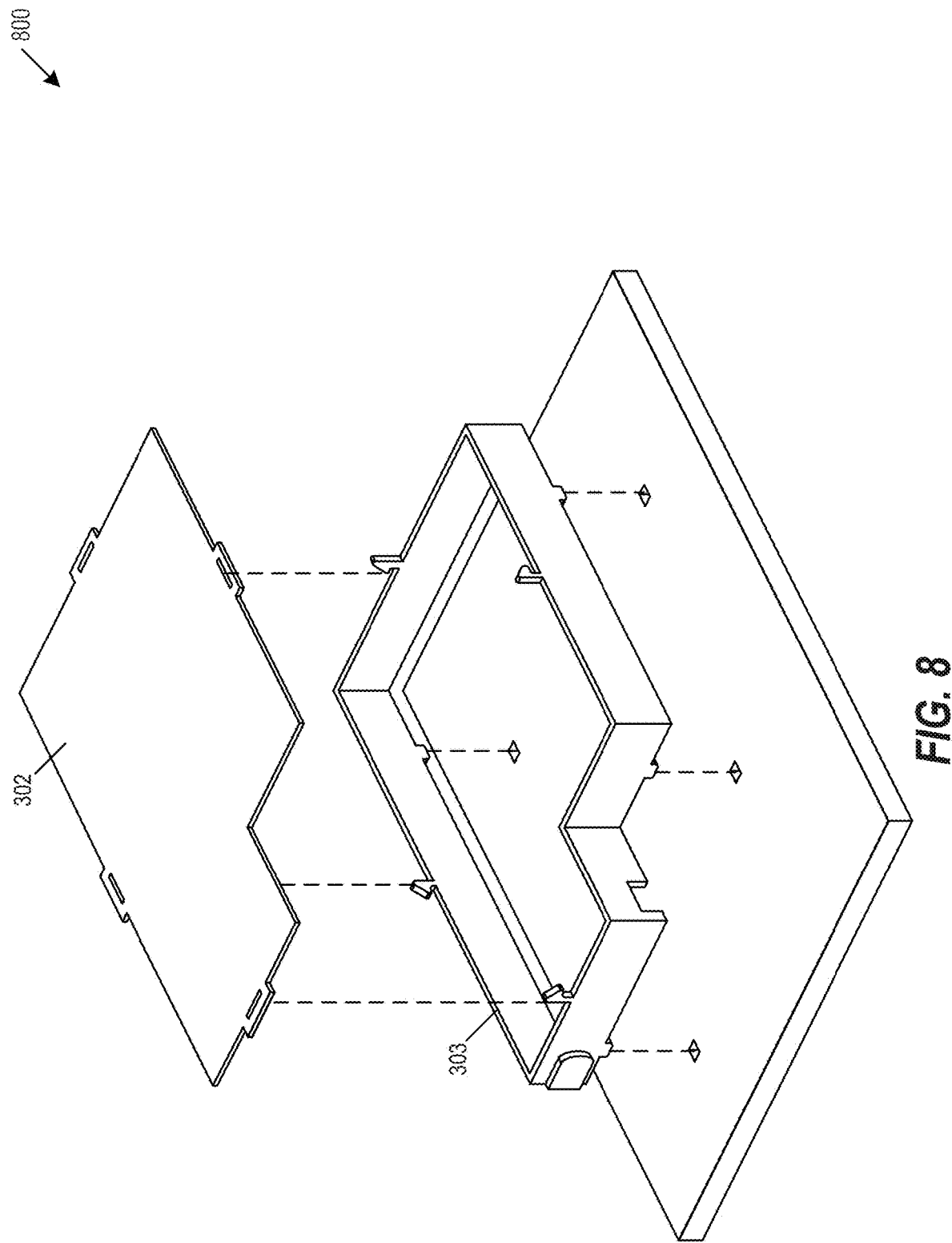
FIG. 8 is a perspective view of a two-piece EMI shield design, in accordance with at least one embodiment of the invention.

FIG. 8 is a perspective view of a two-piece EMI shield design 800, in accordance with at least one embodiment of the invention. Design 800 includes a two-piece EMI enclosure, including an EMI frame 303 and an EMI lid 302. Various components from the existing design 800 are moved to a FEMIE, and the FEMIE is used to replace the EMI frame 303 and lid 302. To enable connections between the PCB and FEMIE components, the FEMIE replaces both the EMI frame 303 and lid 302, and the FEMIE routes signals through side walls to contact pads.

Figure 9:
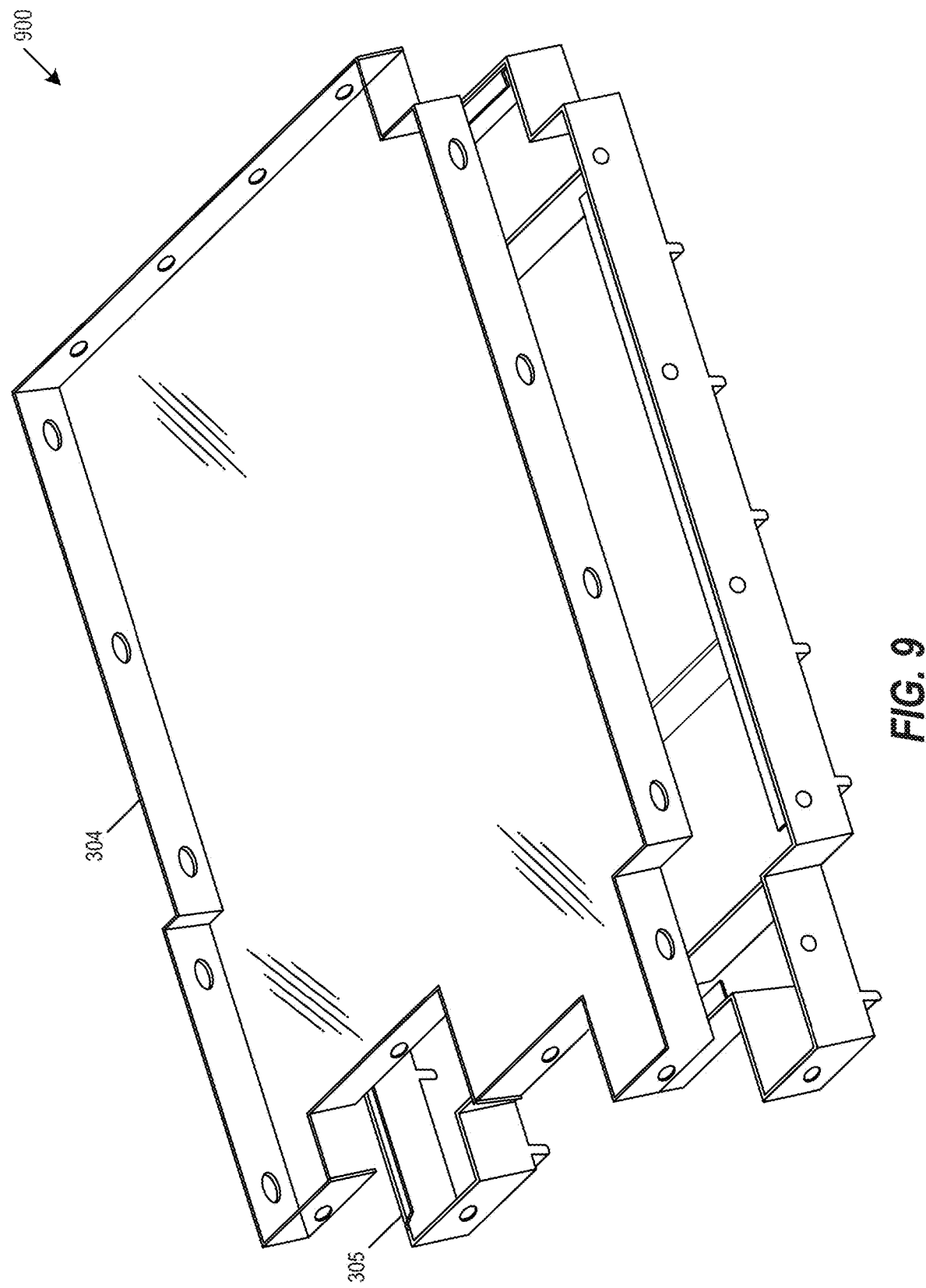
FIG. 9 is a perspective view of a two-piece compartment shield design, in accordance with at least one embodiment of the invention.

FIG. 9 is a perspective view of a two-piece compartment shield design 900, in accordance with at least one embodiment of the invention. Design 900 includes a two-piece EMI enclosure, including a compartmentalized EMI frame 305 and an EMI lid 304. Various components from the existing design 900 are moved to a FEMIE, and the FEMIE is used to replace the EMI frame 305 and lid 304. To enable connections between the PCB and FEMIE components, the FEMIE replaces either the EMI lid 304 or replaces the EMI frame 305 and lid 304. The FEMIE routes signals through side walls to contact pads, such as shown in FIG. 10.

FIG. 10 is a bottom perspective view of a shielded FEMIE 1000, in accordance with at least one embodiment of the invention. Shielded FEMIE 1000 is formed from a flat, flexible PCB (FPC), folded into the desired configuration. The use of FPC enables the shielded FEMIE 1000 to be trimmed and folded to form various shapes and dimensions. The shielded FEMIE 1000 shown in FIG. 10 is folded into a rectangular box structure, though the FPC may be folded into a right-angle structure, into a semicircle structure, or into a structure of another shape. In an example, the FPC bending radius is approximately three times the FPC thickness. In an example, FPC seams 401 and joints 402 are treated using solder, spot welding, gaskets, or other PCB treatments. The treatment of seams 401 and joints 402 enables the shielded FEMIE 1000 to be used in complex shapes and compartmental shield applications. In an example, a seam length is selected based on the frequency of various components on the shielded FEMIE 1000 or the base PCB. Cover film openings may be routed (e.g., cut) before or after formation of the shielded FEMIE 1000 to allow access to one or both sides of the shielded FEMIE 1000 copper layer. For example, an opening may be cut to allow a cable to be routed to access an internal FEMIE connector.

The shielded FEMIE 1000 is designed to facilitate connection to the underlying PCB. In surface mount example, the shielded FEMIE 1000 includes solder contact pads or a land grid array (LGA) 403, and the shielded FEMIE 1000 is affixed to the base PCB using anisotropic conductive film (ACF) filled around the perimeter of LGA 403. In a connector example, the shielded FEMIE 1000 includes a connector for a board-to-board (B2B) connection with the base PCB, such as a zero insertion force (ZIF) wire-to-board connector. In a hybrid example, the shielded FEMIE 1000 includes a combination of an LGA 403 and a B2B connection, and uses ACF to secure the shielded FEMIE 1000 to the base PCB.

Figure 11:
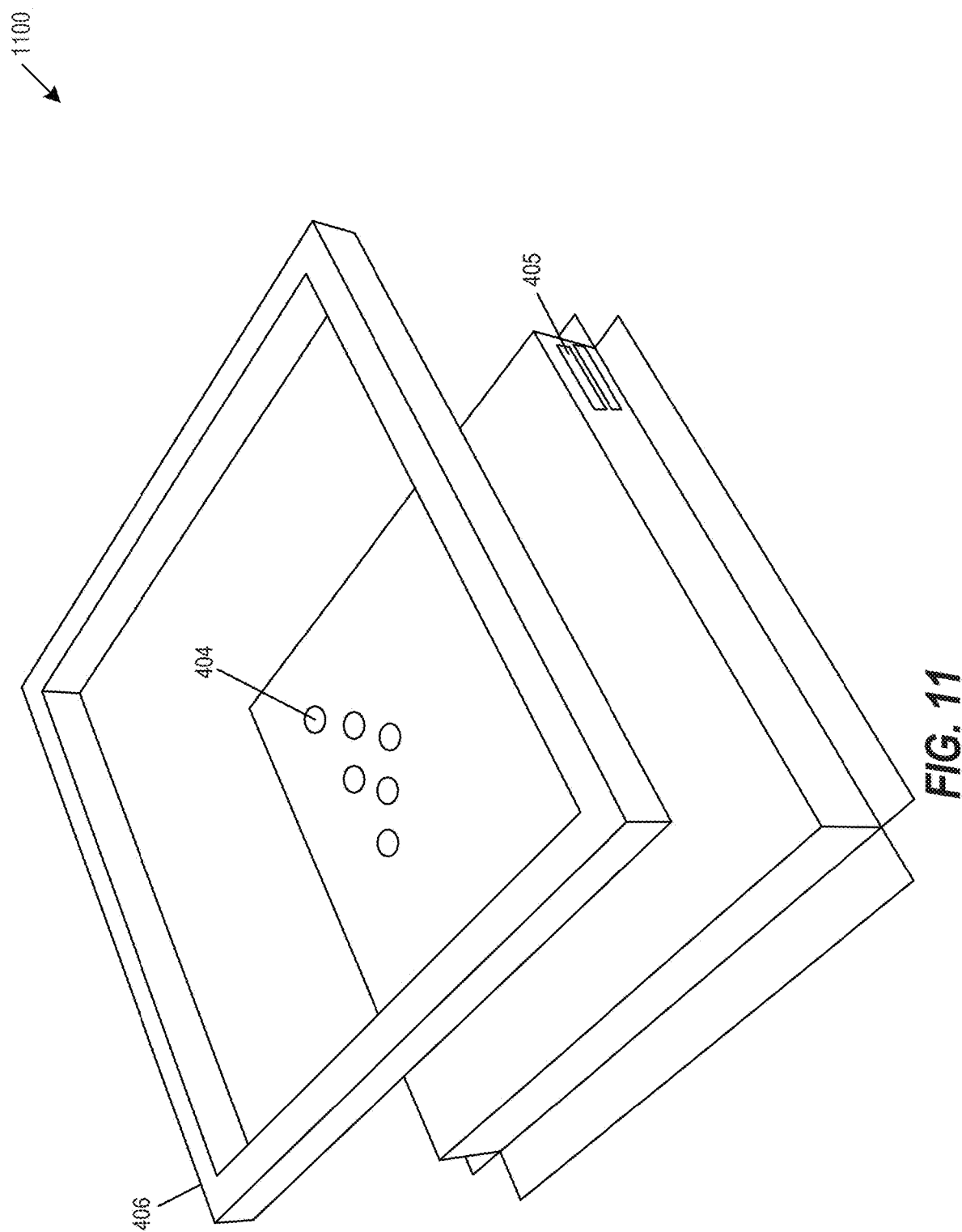
FIG. 11 is a top perspective view of a shielded FEMIE, in accordance with at least one embodiment of the invention.

FIG. 11 is a top perspective view of a shielded FEMIE 1100, in accordance with at least one embodiment of the invention. In an example, shielded FEMIE 1100 includes through-holes 404 or slots 405 to improve heat dissipation and to allow for component adjustment. In an example, the structure of the shielded FEMIE 1100 is reinforced using a frame 406, using board-to-housing adhesive, or using soft compressible foam.

Figure 12:
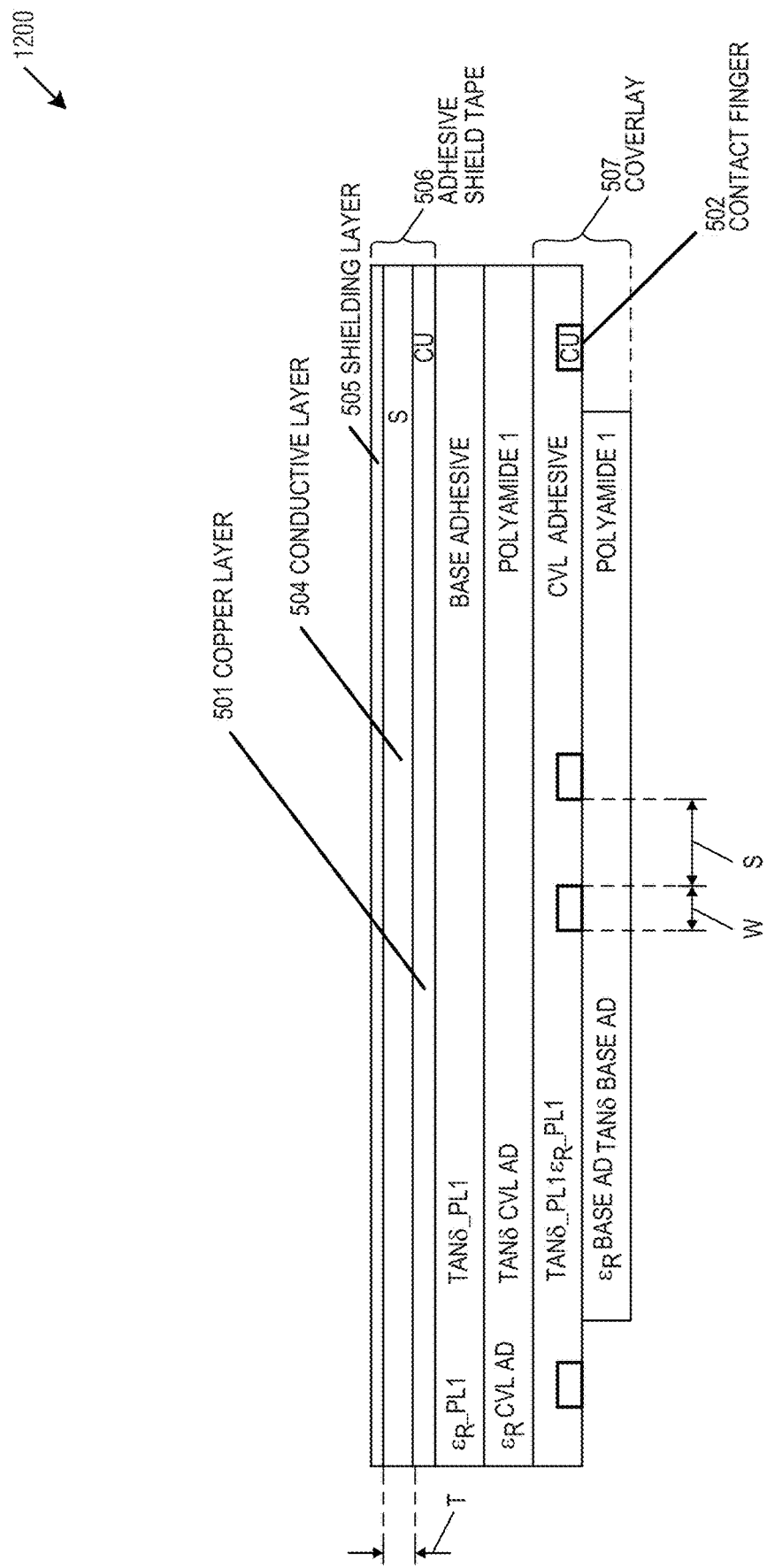
FIG. 12 is a sectional view of a first FPC material stack-up, in accordance with at least one embodiment of the invention.

FIG. 12 is a sectional view of a first FPC material stack-up 1200, in accordance with at least one embodiment of the invention. First stack-up 1200 includes a shield adhesive tape 506, where the shield adhesive tape 506 includes a copper layer 501, a conductive layer 504, and a shielding layer 505. The shield adhesive tape 506 may be omitted from the first stack-up 1200 if EMI shielding is not required, or if only the B2B interconnect function is needed. First stack-up 1200 includes one or more layers of coverlay 507, which includes adhesive and a polyamide. First stack-up 1200 includes a contact finger (e.g., spring finger, grounding finger) to provide grounding or shielding between the shielded FEMIE and the base PCB. In an example, the first stack-up 1200 is used in the flexible portion of a shielded FEMIE.

Figure 13:
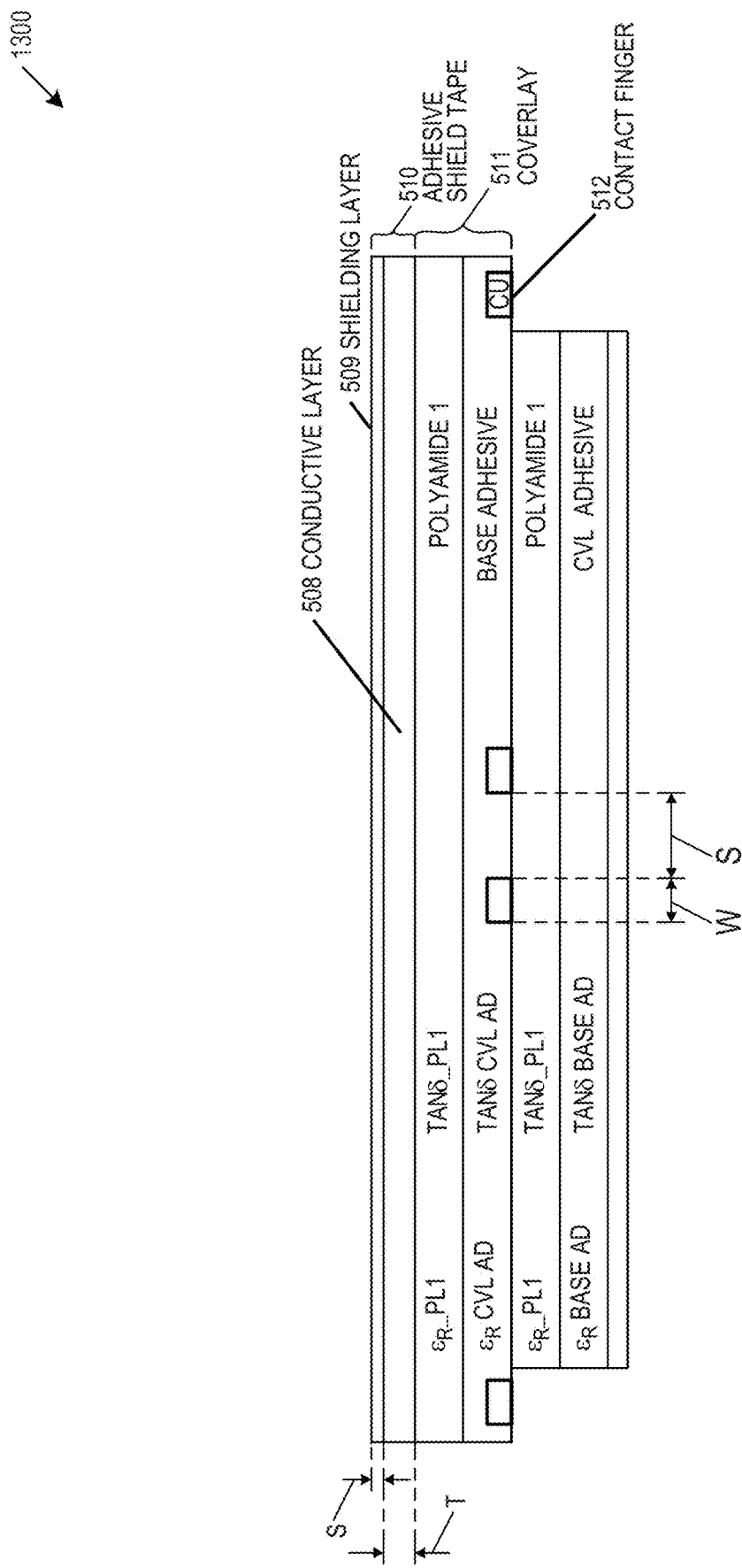
FIG. 13 is a sectional view of a second FPC material stack-up, in accordance with at least one embodiment of the invention.

FIG. 13 is a sectional view of a second FPC material stack-up 1300, in accordance with at least one embodiment of the invention. Second stack-up 1300 includes a shield adhesive tape 510, where the shield adhesive tape 510 includes a conductive layer 508 and a shielding layer 509. The shield adhesive tape 510 may be omitted from the second stack-up 1300 if EMI shielding is not required or if only the B2B interconnect function is needed. Second stack-up 1300 also includes one or more layers of coverlay 511, and one or more contact fingers 512. In an example, the second stack-up 1300 is used in the flexible portion of a shielded FEMIE.

Figure 14:
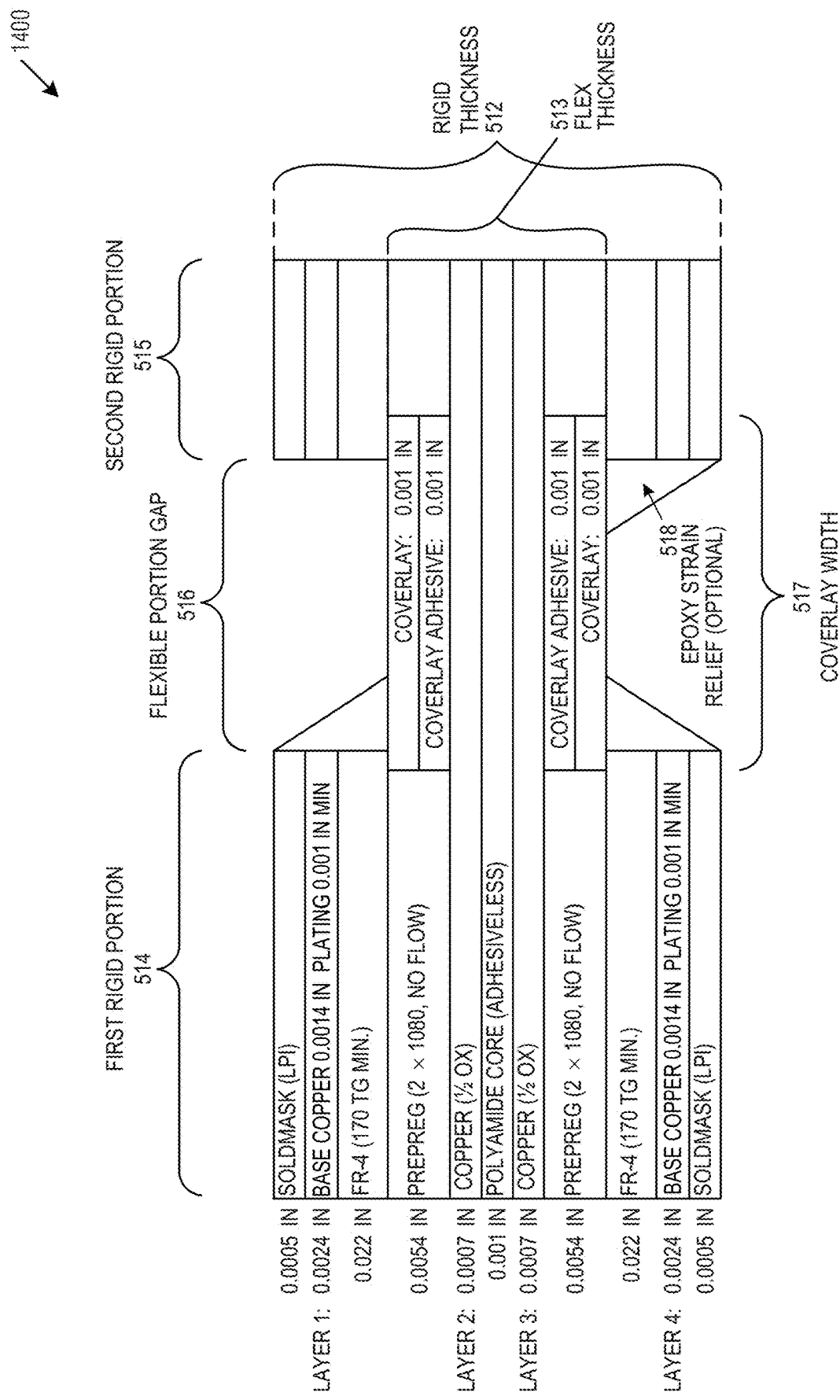
FIG. 14 is a sectional view of a third FPC material stack-up, in accordance with at least one embodiment of the invention.

FIG. 14 is a sectional view of a third FPC material stack-up 1400, in accordance with at least one embodiment of the invention. Third stack-up 1400 includes a first rigid portion 514 and a second rigid portion 515. In an example, the first and second rigid portions 514 and 515 include one or more layers of copper, solder mask, glass-reinforced epoxy laminate sheet (e.g., FR-4), or resin-reinforced fabric (e.g., prepreg). The first and second rigid portions 514 and 515 have an associated rigid thickness 512. Third stack-up 1400 includes a flexible portion 516, such as first and second FPC material stack-ups 1200 and 1300. In an example, third stack-up 1400 includes one or more layers of coverlay, adhesive, copper, and polyamide. Flexible portion 516 has an associated flexible portion thickness 513, where the flexible portion thickness 513 is smaller than the rigid portion thickness 512. In an example, the width of the flexible portion 516 is smaller than the coverlay width 517. In an example the flexible portion 516 is reinforced using epoxy 518 or other suitable strain relief. Inspection of a curved portion of a circuit board may be used to detect if the circuit board was manufactured using flexible circuit board techniques. For example, the curved portion may include a stack of flexible materials, such as those shown in flexible portion 516. In another example, the materials within the curved portion may be examined to determine if they exhibit elastic (reversible) deformation, inelastic (irreversible) deformation, molecular faults associated with metal fatigue caused by elastic deformation, or other signs of deformation.

Figure 15:
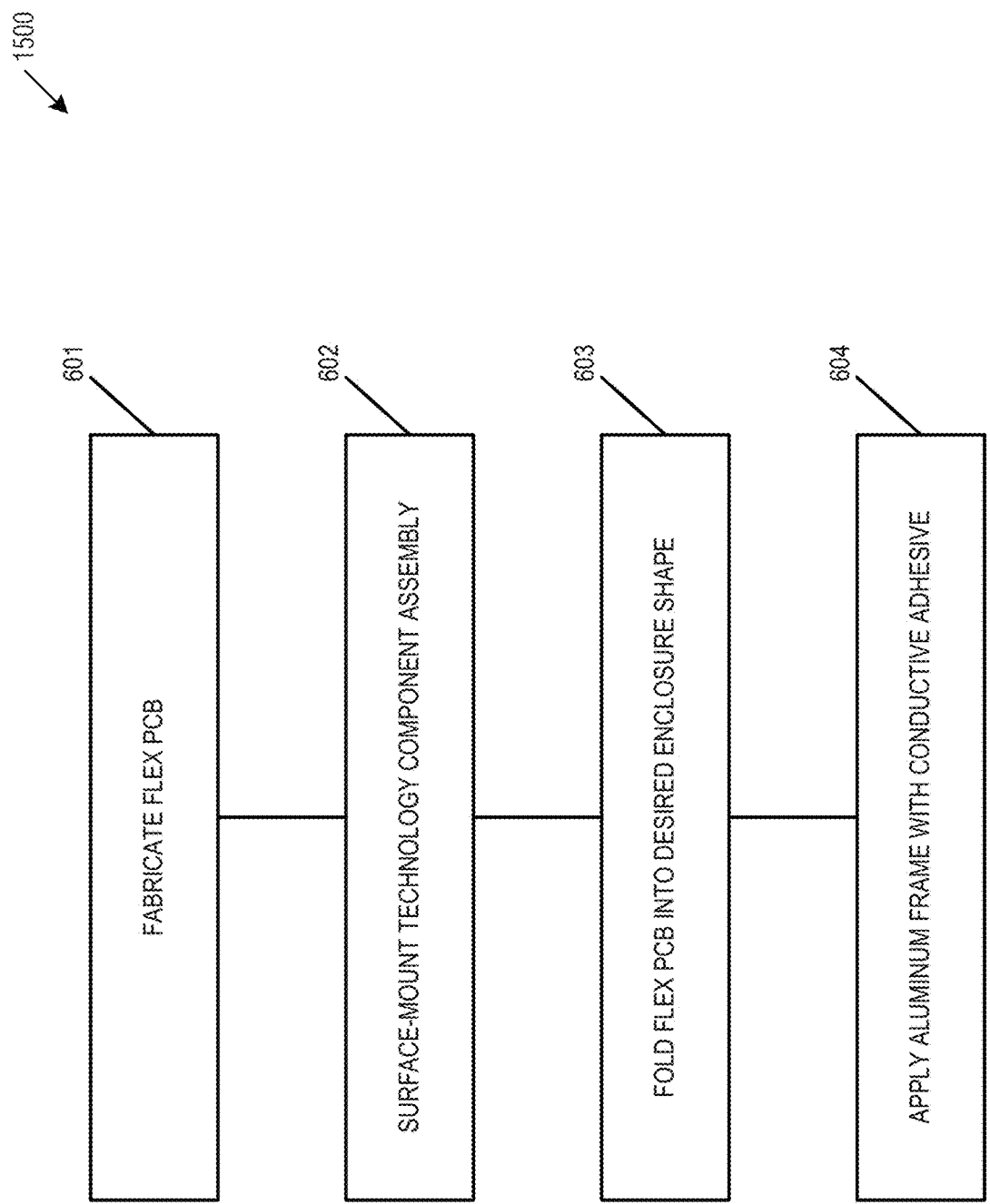
FIG. 15 is a block diagram of an FPC fabrication method, in accordance with at least one embodiment of the invention.

FIG. 15 is a block diagram of an FPC fabrication method 1500, in accordance with at least one embodiment of the invention. Method 1500 includes fabricating 601 the FPC. Fabrication 601 includes forming pads for components, input/output (e.g., I/O) contacts, power contacts, and ground contacts on one or more sides of the PCB. In an example, a bonding sheet of thick polyimide or acrylic is added to the center of the PCB stack-up to increase the stiffness of the FPC. Fabrication 601 also includes cutting the FPC to a desired shape.

Method 1500 includes assembling 602 the surface-mount technology (SMT) components. Assembly 602 includes solder paste printing, SMT component placement, and reflowing solder between the FPC and the SMT components. Assembly 602 includes a cutting and routing process to form the assembled FPC with SMT components. In an example, the SMT assembly process is improved by including multiple FPCs within a single assembly working panel and batch processing assembly 602.

Method 1500 includes folding 603 the FPC into a desired enclosure shape. In an example, folding 603 is accomplished using a fixture block, where the fixture block aids in folding 603 the FPC into a specific enclosure shape. The fixture block may be removed following folding 603 the FPC, or may be removed following application of a frame.

Method 1500 includes applying 604 a rigid frame. In an example, the frame is formed from a metal such as aluminum, a rigid polymer, or other rigid material. In an example, applying 604 the frame includes applying a conductive adhesive between the frame and the FPC. The frame improves the ability of the FEMIE to retain the desired enclosure shape, and improves overall structural stability of the FEMIE.

Figure 16:
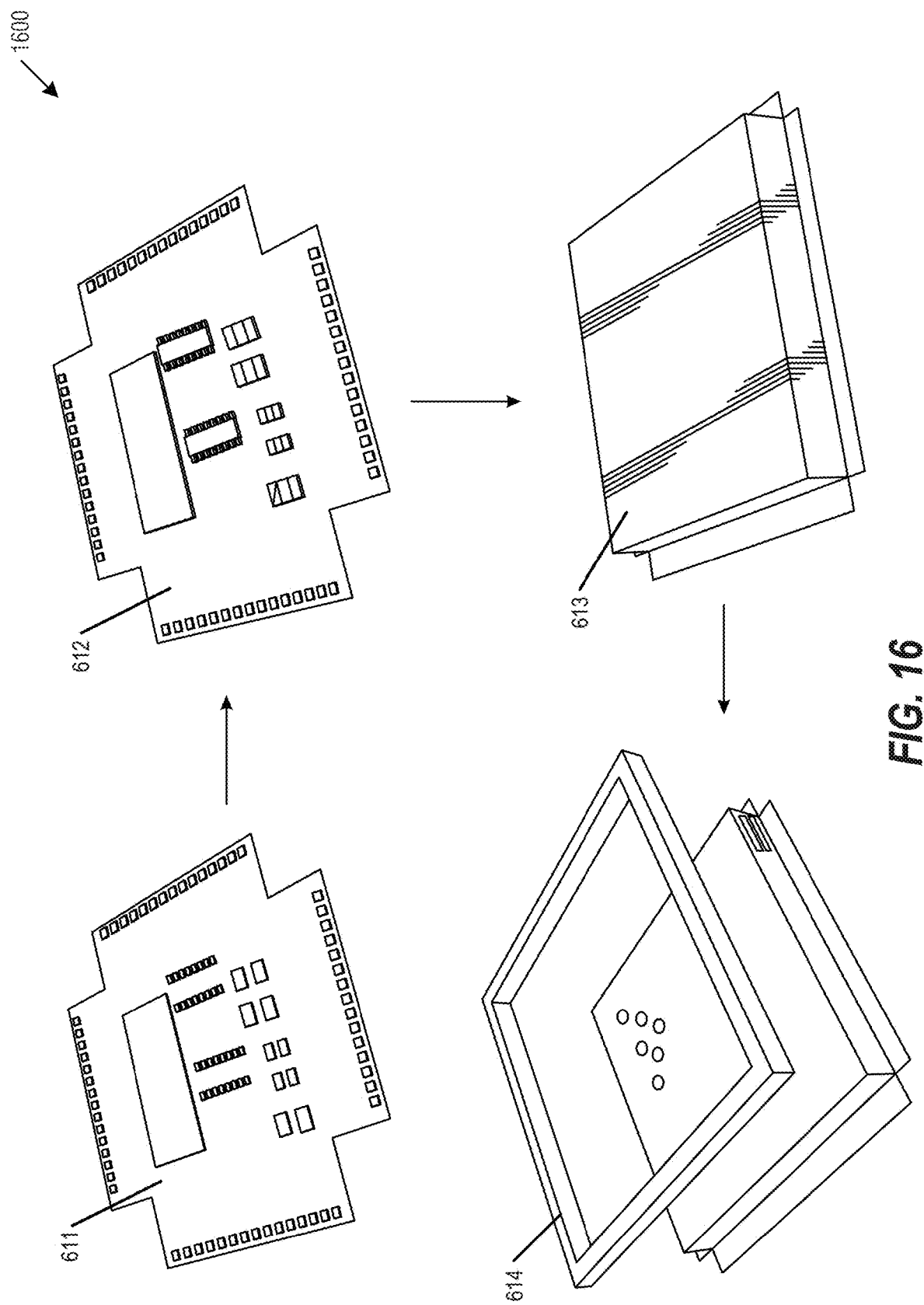
FIG. 16 is a perspective view of FPC fabrication method, in accordance with at least one embodiment of the invention.

FIG. 16 is a perspective view of FPC fabrication method 1600, in accordance with at least one embodiment of the invention. Perspective view of FPC fabrication method 1600 depicts steps from FPC fabrication method 1500. FPC fabrication method 1600 includes fabrication 611, which includes forming pads and cutting the FPC to a desired shape. Method 1600 includes assembling 612 solder paste printing, SMT component placement, and reflowing solder between the FPC and the SMT components. From assembly 612, the FPC is turned over and folded 613 into a desired enclosure shape, such as using a fixture block. The FPC is then framed 614, such as using a rigid frame formed from metal or rigid polymer to improve the structural stability of the FEMIE.

Figure 17:
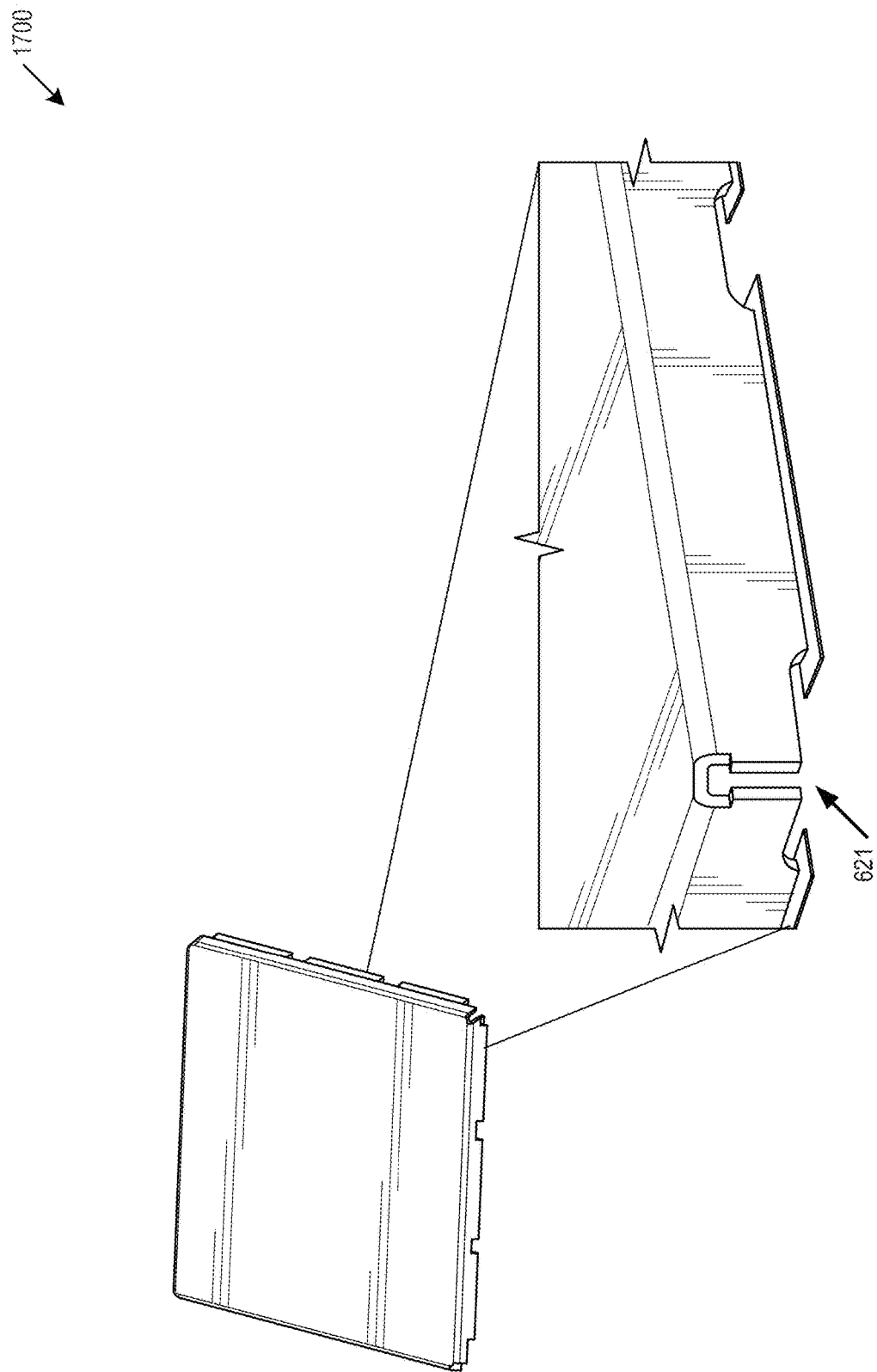
FIG. 17 is a perspective view of a fabricated FPC, in accordance with at least one embodiment of the invention.

FIG. 17 is a perspective view of a fabricated FPC 1700, in accordance with at least one embodiment of the invention. The corner 621 may be modified to address the presence of seams or joints, such as seam 401 and joint 402 shown in FIG. 4. In an example, modification of corner 621 includes soldering the seam, spot welding, applying a gasket, or other modification. In an example, the EMI properties of the shielded FEMIE may not require modification of smaller seams, such as seams less than 1.5 cm in length.

Figure 18:
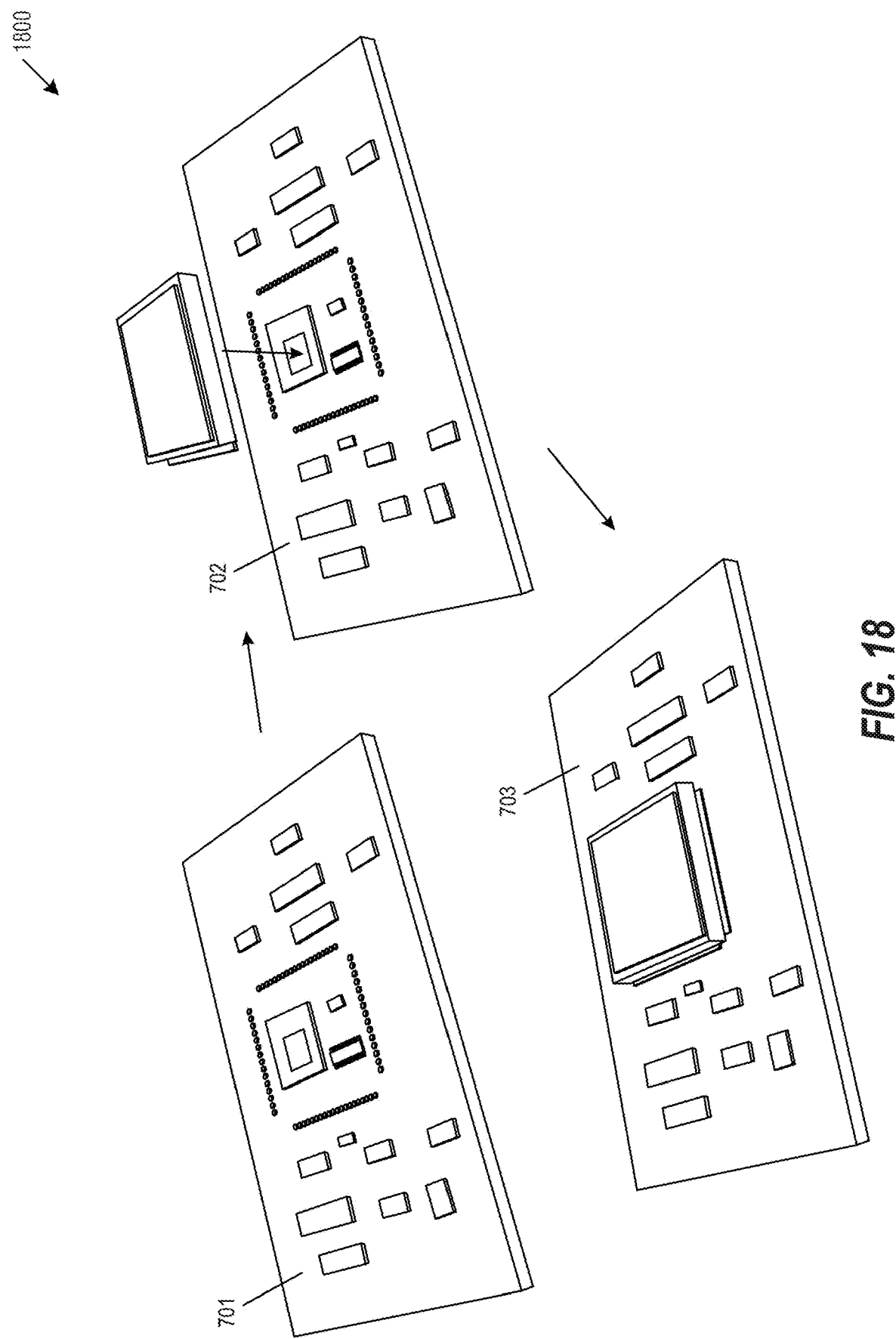
FIG. 18 is a perspective view of FPC assembly, in accordance with at least one embodiment of the invention.

FIG. 18 is a perspective view of FPC assembly 1800, in accordance with at least one embodiment of the invention. Assembly 1800 includes fabrication 701 of the rigid base PCB. The rigid PCB is fabricated using copper patterning, etching, lamination, drilling, solder resist application, or other rigid PCB fabrication techniques. Assembly 1800 includes assembly and placement 702 of the SMT components. Assembly and placement 702 includes applying solder paste to the rigid base PCB and placing SMT components and shielded FEMIE. Placement of the SMT components and shielded FEMIE includes aligning pads on each of the SMT components and shielded FEMIE with corresponding pads on the rigid base PCB. Assembly 1800 includes reflowing 703 the solder paste to provide electrical and mechanical connections between the rigid base PCB, the SMT components, and the shielded FEMIE.

Figure 19:
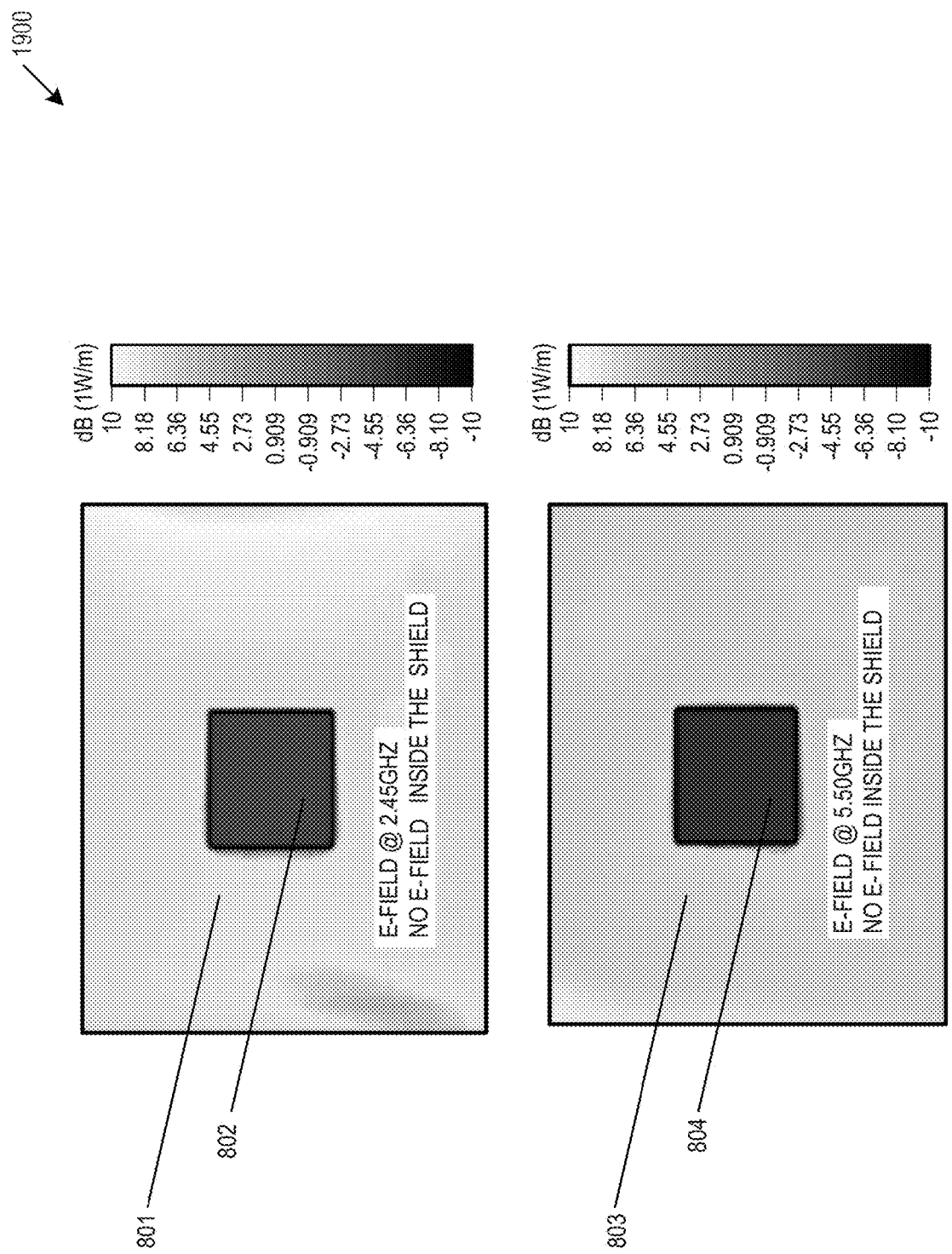
FIG. 19 is a graph of an EMI simulation result, in accordance with at least one embodiment of the invention.

FIG. 19 is a graph of an EMI simulation result 1900, in accordance with at least one embodiment of the invention. EMI result 1900 shows the electric field emanating from a first base PCB 801 and from a first shielded FEMIE 802 at 2.45 GHz. While a positive e-field is present on the first base PCB 801, there is little or no e-field present on the first shielded FEMIE 802. EMI result 1900 also shows the electric field emanating from a second base PCB 803 and from a second shielded FEMIE 804 at 5.50 GHz. Again, while a positive e-field is present on the second base PCB 803, there is little or no e-field present on the second shielded FEMIE 804.

Figure 20:
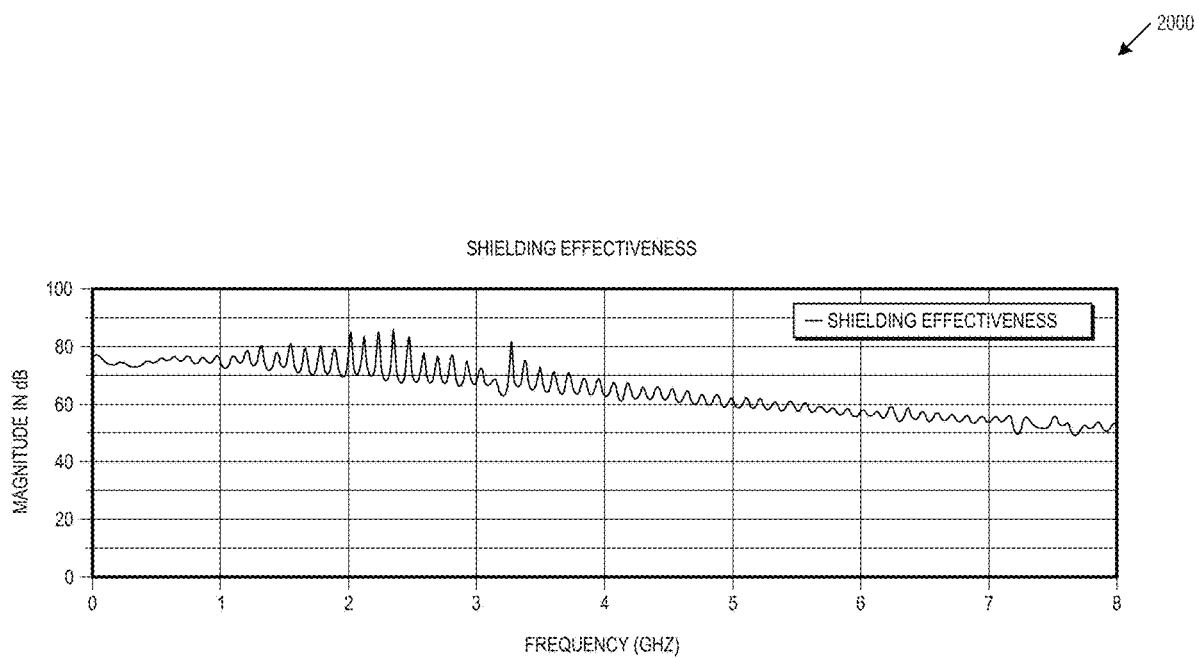
FIG. 20 is a graph of a shielding effectiveness simulation result, in accordance with at least one embodiment of the invention.

FIG. 20 is a graph of a shielding effectiveness simulation result 2000, in accordance with at least one embodiment of the invention. Shielding result 2000 shows the shielded FEMIE provides approximately 50 dB or greater EMI attenuation from 0 Hz through 8 GHz. This demonstrates that the shielded FEMIE provides EMI shielding comparable to a conventional EMI enclosure, while reducing the total circuit board volume compared to the use of a conventional EMI enclosure.

Figure 21:
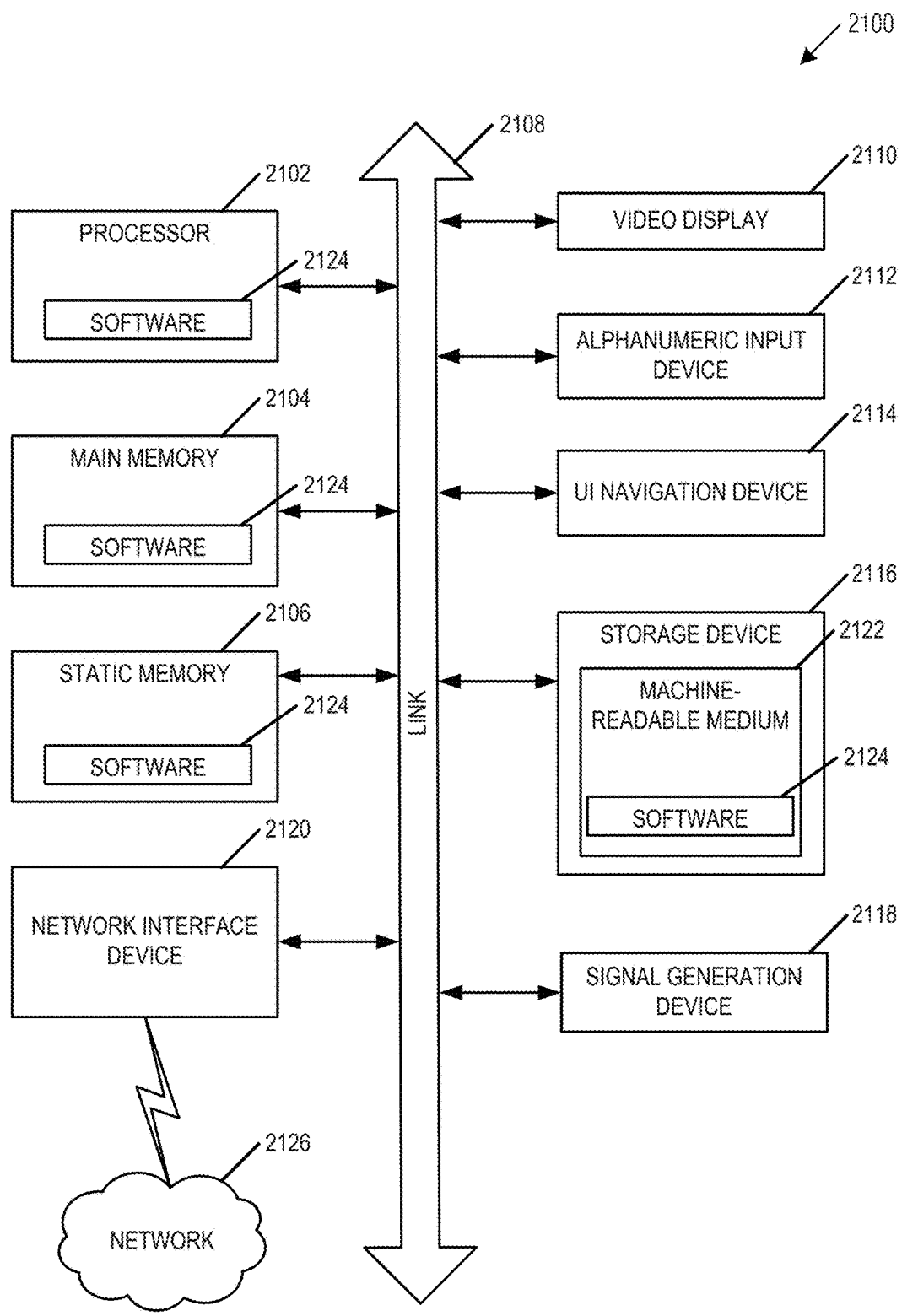
FIG. 21 is a block diagram illustrating a machine in the example form of a computer system, within which a set or sequence of instructions may be executed to cause the machine to perform any one of the manufacturing methodologies discussed herein, according to an example embodiment.

FIG. 21 is a block diagram illustrating a machine in the example form of a computer system 2100, within which a set or sequence of instructions may be executed to cause the machine to perform any one of the manufacturing methodologies discussed herein, according to an example embodiment. In an example, computer system 2100 is implemented on a shielded FEMIE as discussed herein. In alternative embodiments, the machine operates as a standalone device or may be connected (e.g., networked) to other machines. In a networked deployment, the machine may operate in the capacity of either a server or a client machine in server-client network environments, or it may act as a peer machine in peer-to-peer (or distributed) network environments. The machine may be a portable electronic device, personal computer (PC), a tablet PC, a hybrid tablet, a personal digital assistant (PDA), a mobile telephone, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. Similarly, the term "processor-based system" shall be taken to include any set of one or more machines that are controlled by or operated by a processor (e.g., a computer) to individually or jointly execute instructions to perform any one or more of the methodologies discussed herein.

Example computer system 2100 includes at least one processor 2102 (e.g., a central processing unit (CPU), a graphics processing unit (GPU) or both, processor cores, compute nodes, etc.), a main memory 2104 and a static memory 2106, which communicate with each other via a link 2108 (e.g., bus). The computer system 2100 may further include a video display unit 2110, an alphanumeric input device 2112 (e.g., a keyboard), and a user interface (UI) navigation device 2114 (e.g., a mouse). In one embodiment, the video display unit 2110, input device 2112 and UI navigation device 2114 are incorporated into a touch screen display. The computer system 2100 may additionally include a storage device 2116 (e.g., a drive unit), a signal generation device 2118 (e.g., a speaker), a network interface device 2120, and one or more sensors (not shown), such as a global positioning system (GPS) sensor, compass, accelerometer, or other sensor.

The storage device 2116 includes a machine-readable medium 2122 on which is stored one or more sets of data structures and instructions 2124 (e.g., software) embodying or utilized by any one or more of the methodologies or functions described herein. The instructions 2124 may also reside, completely or at least partially, within the main memory 2104, static memory 2106, and/or within the processor 2102 during execution thereof by the computer system 2100, with the main memory 2104, static memory 2106, and the processor 2102 also constituting machine-readable media.

While the machine-readable medium 2122 is illustrated in an example embodiment to be a single medium, the term "machine-readable medium" may include a single medium or multiple media (e.g., a centralized or distributed database, and/or associated caches and servers) that store the one or more instructions 2124. The term "machine-readable medium" shall also be taken to include any tangible medium that is capable of storing, encoding or carrying instructions for execution by the machine and that cause the machine to perform any one or more of the methodologies of the present disclosure or that is capable of storing, encoding or carrying data structures utilized by or associated with such instructions. The term "machine-readable medium" shall accordingly be taken to include, but not be limited to, solid-state memories, and optical and magnetic media. Specific examples of machine-readable media include non-volatile memory, including but not limited to, by way of example, semiconductor memory devices (e.g., electrically programmable read-only memory (EPROM), electrically erasable programmable read-only memory (EEPROM)) and flash memory devices; magnetic disks such as internal hard disks and removable disks; magneto-optical disks; and CD-ROM and DVD-ROM disks.

The instructions 2124 may further be transmitted or received over a communications network 2126 using a transmission medium via the network interface device 2120 utilizing any one of a number of well-known transfer protocols (e.g., HTTP). Examples of communication networks include a local area network (LAN), a wide area network (WAN), the Internet, mobile telephone networks, plain old telephone (POTS) networks, and wireless data networks (e.g., Wi-Fi, Bluetooth, Bluetooth LE, 3G, 4G LTE/LTE-A, WiMAX networks, etc.). The term "transmission medium" shall be taken to include any intangible medium that is capable of storing, encoding, or carrying instructions for execution by the machine, and includes digital or analog communications signals or other intangible medium to facilitate communication of such software.

To better illustrate the method and apparatuses disclosed herein, a non-limiting list of embodiments is provided here:

Example 1 is a semiconductor device comprising: one or more dies coupled to a first circuit board; and a flexible circuit board folded over the one or more dies to form at least two walls and a cover, the flexible board electrically coupled to the first circuit board; and one or more additional components coupled to the cover and positioned adjacent to the one or more dies.

In Example 2, the subject matter of Example 1 optionally includes wherein the flexible circuit board is folded to form four walls and the cover.

In Example 3, the subject matter of any one or more of Examples 1-2 optionally include wherein the flexible circuit board includes an electromagnetic interference (EMI) shield layer.

In Example 4, the subject matter of Example 3 optionally includes wherein the flexible circuit board is formed into an EMI shield structure.

In Example 5, the subject matter of any one or more of Examples 1-4 optionally include wherein the one or more dies include a processor die and a memory die.

In Example 6, the subject matter of any one or more of Examples 1-5 optionally include wherein the flexible circuit board includes components on both sides of the cover.

In Example 7, the subject matter of any one or more of Examples 1-6 optionally include wherein the flexible circuit board includes a bent edge with a bend radius of approximately three times a thickness of the flexible circuit board.

In Example 8, the subject matter of any one or more of Examples 1-7 optionally include wherein the flexible circuit board includes a folded corner.

In Example 9, the subject matter of Example 8 optionally includes wherein the folded corner includes a notch.

In Example 10, the subject matter of any one or more of Examples 8-9 optionally include wherein the folded corner includes a strain relief.

In Example 11, the subject matter of Example 10 optionally includes wherein the strain relief includes a solder reinforcement, a welded reinforcement, a gasket reinforcement and an adhesive resin.

In Example 12, the subject matter of any one or more of Examples 1-11 optionally include wherein the flexible circuit board includes at least one flexible circuit board electrical contact.

In Example 13, the subject matter of Example 12 optionally includes wherein the flexible circuit board electrical contact includes at least one of a contact pad and a finger contact.

In Example 14, the subject matter of any one or more of Examples 12-13 optionally include wherein: a solder paste is disposed between the flexible circuit board electrical contact and a first circuit board contact; and the solder paste is reflowed to provide an electrical and mechanical connection between the flexible circuit board electrical contact and the first circuit board contact.

In Example 15, the subject matter of any one or more of Examples 1-14 optionally include a fixture block to fold the flexible circuit board into a desired enclosure shape.

In Example 16, the subject matter of any one or more of Examples 1-15 optionally include wherein the flexible circuit board includes a structural reinforcement layer.

In Example 17, the subject matter of Example 16 optionally includes wherein the structural reinforcement layer includes at least one of polyimide, acrylic, and epoxy.

In Example 18, the subject matter of any one or more of Examples 1-17 optionally include a rigid frame applied to the flexible circuit board.

In Example 19, the subject matter of Example 18 optionally includes wherein the frame is formed from at least one of a metal and a rigid polymer.

In Example 20, the subject matter of any one or more of Examples 18-19 optionally include a conductive adhesive applied between the frame and the flexible circuit board.

Example 21 is an volumetric semiconductor method comprising: disposing one or more dies on a first circuit board; disposing one or more additional components on a cover portion of a flexible circuit board; and folding the flexible circuit board over the one or more dies to form at least two walls and the cover, the flexible board electrically coupled to the first circuit board, and the additional components positioned adjacent to the one or more dies.

In Example 22, the subject matter of Example 21 optionally includes wherein folding the flexible circuit board forms four walls and the cover.

In Example 23, the subject matter of any one or more of Examples 21-22 optionally include wherein the flexible circuit board includes an electromagnetic interference (EMI) shield layer.

In Example 24, the subject matter of Example 23 optionally includes wherein folding the flexible circuit board includes folding the flexible circuit board into an EMI shield structure.

In Example 25, the subject matter of any one or more of Examples 21-24 optionally include wherein the one or more dies include a processor die and a memory die.

In Example 26, the subject matter of any one or more of Examples 21-25 optionally include wherein the flexible circuit board includes components on both sides of the cover.

In Example 27, the subject matter of any one or more of Examples 21-26 optionally include wherein the flexible circuit board includes a bent edge with a bend radius of approximately three times a thickness of the flexible circuit board.

In Example 28, the subject matter of any one or more of Examples 21-27 optionally include wherein folding the flexible circuit board includes forming a folded corner.

In Example 29, the subject matter of Example 28 optionally includes wherein the folded corner includes a notch.

In Example 30, the subject matter of any one or more of Examples 28-29 optionally include wherein forming the folded corner includes applying a strain relief.

In Example 31, the subject matter of Example 30 optionally includes wherein applying the strain relief includes applying at least one of a solder reinforcement, a welded reinforcement, a gasket reinforcement and an adhesive resin.

In Example 32, the subject matter of any one or more of Examples 21-31 optionally include wherein the flexible circuit board includes at least one flexible circuit board electrical contact.

In Example 33, the subject matter of Example 32 optionally includes wherein the flexible circuit board electrical contact includes at least one of a contact pad and a finger contact.

In Example 34, the subject matter of any one or more of Examples 32-33 optionally include disposing a solder paste between the flexible circuit board electrical contact and a first circuit board contact; and reflowing the solder paste to provide an electrical and mechanical connection between the flexible circuit board electrical contact and the first circuit board contact.

In Example 35, the subject matter of any one or more of Examples 21-34 optionally include wherein folding the flexible circuit board includes applying a fixture block to fold the flexible circuit board into a desired enclosure shape.

In Example 36, the subject matter of any one or more of Examples 21-35 optionally include wherein the flexible circuit board includes a structural reinforcement layer.

In Example 37, the subject matter of Example 36 optionally includes wherein the structural reinforcement layer includes at least one of polyimide, acrylic, and epoxy.

In Example 38, the subject matter of any one or more of Examples 21-37 optionally include wherein folding the flexible circuit board includes applying a rigid frame to the flexible circuit board.

In Example 39, the subject matter of Example 38 optionally includes wherein the frame is formed from at least one of a metal and a rigid polymer.

In Example 40, the subject matter of any one or more of Examples 38-39 optionally include applying a conductive adhesive between the frame and the flexible circuit board.

Example 41 is a machine-readable medium including instructions, which when executed by a computing system, cause the computing system to perform any of the methods of Examples 21-40.

Example 42 is a device comprising means for performing any of the methods of Examples 21-40.

Example 43 is a semiconductor device comprising: means for disposing one or more dies on a first circuit board; means for disposing one or more additional components on a cover portion of a flexible circuit board; and means for folding the flexible circuit board over the one or more dies to form at least two walls and the cover, the flexible board electrically coupled to the first circuit board, and the additional components positioned adjacent to the one or more dies.

In Example 44, the subject matter of Example 43 optionally includes wherein means for folding the flexible circuit board forms four walls and the cover.

In Example 45, the subject matter of any one or more of Examples 43-44 optionally include wherein the flexible circuit board includes an electromagnetic interference (EMI) shield layer.

In Example 46, the subject matter of Example 45 optionally includes wherein means for folding the flexible circuit board includes folding the flexible circuit board into an EMI shield structure.

In Example 47, the subject matter of any one or more of Examples 43-46 optionally include wherein the one or more dies include a processor die and a memory die.

In Example 48, the subject matter of any one or more of Examples 43-47 optionally include wherein the flexible circuit board includes components on both sides of the cover.

In Example 49, the subject matter of any one or more of Examples 43-48 optionally include wherein the flexible circuit board includes a bent edge with a bend radius of approximately three times a thickness of the flexible circuit board.

In Example 50, the subject matter of any one or more of Examples 43-49 optionally include wherein means for folding the flexible circuit board includes means for forming a folded corner.

In Example 51, the subject matter of Example 50 optionally includes wherein the folded corner includes a notch.

In Example 52, the subject matter of any one or more of Examples 50-51 optionally include wherein means for forming the folded corner includes means for applying a strain relief.

In Example 53, the subject matter of Example 52 optionally includes wherein means for applying the strain relief includes means for applying at least one of a solder reinforcement, a welded reinforcement, a gasket reinforcement and an adhesive resin.

In Example 54, the subject matter of any one or more of Examples 43-53 optionally include wherein the flexible circuit board includes at least one flexible circuit board electrical contact.

In Example 55, the subject matter of Example 54 optionally includes wherein the flexible circuit board electrical contact includes at least one of a contact pad and a finger contact.

In Example 56, the subject matter of any one or more of Examples 54-55 optionally include means for disposing a solder paste between the flexible circuit board electrical contact and a first circuit board contact; and means for reflowing the solder paste to provide an electrical and mechanical connection between the flexible circuit board electrical contact and the first circuit board contact.

In Example 57, the subject matter of any one or more of Examples 43-56 optionally include wherein means for folding the flexible circuit board includes means for applying a fixture block to fold the flexible circuit board into a desired enclosure shape.

In Example 58, the subject matter of any one or more of Examples 43-57 optionally include wherein the flexible circuit board includes a structural reinforcement layer.

In Example 59, the subject matter of Example 58 optionally includes wherein the structural reinforcement layer includes at least one of polyimide, acrylic, and epoxy.

In Example 60, the subject matter of any one or more of Examples 43-59 optionally include wherein means for folding the flexible circuit board includes means for applying a rigid frame to the flexible circuit board.

In Example 61, the subject matter of Example 60 optionally includes wherein the frame is formed from at least one of a metal and a rigid polymer.

In Example 62, the subject matter of any one or more of Examples 60-61 optionally include means for applying a conductive adhesive between the frame and the flexible circuit board.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. In the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A semiconductor device comprising:
   one or more dies coupled to a first rigid base circuit board;
   a flexible circuit board folded over the one or more dies to form at least two walls and a cover, the flexible circuit board electrically coupled to the first rigid base circuit board;
   one or more additional components coupled to the cover and positioned adjacent to the one or more dies, wherein a lower component surface of at least one of the one or more additional components is below an upper die surface of at least one of the one or more dies, and an upper component surface of the at least one of the one or more additional components is above the upper die surface;
   a tab formed from the flexible circuit board, the tab extending from at least one of the at least two walls to provide a physical connection to attach the flexible circuit board in a fixed position relative to the first rigid base circuit board and to provide signal routing between the flexible circuit board and the first rigid base circuit board; and
   a rigid frame applied to an outer surface of the at least two walls and cover formed by the flexible circuit board, the rigid frame including an aperture positioned over the cover.

2. The device of claim 1, wherein the flexible circuit board is folded out of a continuous flexible circuit substrate to form four walls and the cover.

3. The device of claim 1, wherein the flexible circuit board includes an electromagnetic interference (EMI) shield layer.

4. The device of claim 3, wherein the flexible circuit board is formed into an EMI shield structure.

5. The device of claim 1, wherein the one or more dies include a processor die and a memory die.

6. The device of claim 1, wherein the flexible circuit board includes components on both sides of the cover.

7. The device of claim 1, wherein the flexible circuit board includes a bent edge with a bend radius of approximately three times a thickness of the flexible circuit board.

8. The device of claim 1, wherein:
   the flexible circuit board includes at least one flexible circuit board electrical contact disposed on the tab; and
   the flexible circuit board includes one or more signal routings to transport signals between the one or more dies and the first rigid base circuit board via the at least one flexible circuit board electrical contact.

9. The device of claim 8, wherein:
   a solder paste is disposed between the at least one flexible circuit board electrical contact and a first circuit board contact on the first rigid base circuit board; and
   the solder paste is reflowed to provide an electrical and mechanical connection between the at least one flexible circuit board electrical contact and the first circuit board contact.

10. The device of claim 1, further including a fixture block to fold the flexible circuit board into a desired enclosure shape.

11. The device of claim 1, wherein the flexible circuit board includes a structural reinforcement layer.

12. A volumetric semiconductor method comprising:
    disposing one or more dies on a first rigid base circuit board;
    disposing one or more additional components on a cover portion of a flexible circuit board;
    folding the flexible circuit board over the one or more dies to form at least two walls and the cover portion, the flexible circuit board electrically coupled to the first rigid base circuit board, and the additional components positioned adjacent to the one or more dies, wherein a lower component surface of at least one of the one or more additional components is below an upper die surface of at least one of the one or more dies, and the upper die surface of the at least one of the one or more additional components is above the upper die surface, the flexible circuit board including a tab formed from the flexible circuit board, the tab extending from at least one of the at least two walls to provide a physical connection to attach the flexible circuit board in a fixed position relative to the first rigid base circuit board and to provide signal routing between the flexible circuit board and the first rigid base circuit board, wherein the flexible circuit board is folded out of a continuous flexible circuit substrate to form the at least two walls and the cover portion; and
    applying a rigid frame to an outer surface of the at least two walls and cover formed by the flexible circuit board.

13. The method of claim 12, wherein the flexible circuit board includes an electromagnetic interference (EMI) shield layer.

14. The method of claim 13, wherein folding the flexible circuit board includes folding the flexible circuit board into an EMI shield structure.

15. The method of claim 12, wherein the flexible circuit board includes components on both sides of the cover.

16. The method of claim 12, wherein:
    the flexible circuit board includes at least one flexible circuit board electrical contact disposed on the tab; and the flexible circuit board includes one or more signal routings to transport signals between the one or more dies and the first rigid base circuit board via the flexible circuit board electrical contact.

17. The method of claim 16, further including:

disposing a solder paste between the flexible circuit board electrical contact and a first circuit board contact on the first rigid base circuit board; and reflowing the solder paste to provide an electrical and mechanical connection between the flexible circuit board electrical contact and the first circuit board contact.

18. At least one non-transitory machine-readable storage medium, comprising a plurality of instructions that, responsive to being executed with processor circuitry of a computer-controlled device, cause the computer-controlled device to:

dispose one or more dies on a first rigid base circuit board;

dispose one or more additional components on a cover portion of a flexible circuit board;

fold the flexible circuit board over the one or more dies to form at least two walls and the cover portion, the flexible circuit board electrically coupled to the first rigid base circuit board, and the additional components positioned adjacent to the one or more dies, wherein a lower component surface of at least one of the one or more additional components is below an upper die surface of at least one of the one or more dies, and an upper die surface of the at least one of the one or more additional components is above the upper die surface, the flexible circuit board including a tab formed from the flexible circuit board, the tab extending from at least one of the at least two walls to provide a physical connection to attach the flexible circuit board in a fixed position relative to the first rigid base circuit board and to provide signal routing between the flexible circuit board and the first rigid base circuit board, wherein the flexible circuit board is folded out of a continuous flexible circuit substrate to form the at least two walls and the cover portion; and applying a rigid frame to an outer surface of the at least two walls and cover formed by the flexible circuit board.

19. The non-transitory machine-readable storage medium of claim 18, wherein the flexible circuit board includes an electromagnetic interference (EMI) shield layer.

20. The non-transitory machine-readable storage medium of claim 19, wherein the instructions further cause the computer-controlled device to fold the flexible circuit board into an EMI shield structure.

21. The non-transitory machine-readable storage medium of claim 18, wherein:

the flexible circuit board includes at least one flexible circuit board electrical contact disposed on the tab; and the flexible circuit board includes one or more signal routings to transport signals between the one or more dies and the first rigid base circuit board via the at least one flexible circuit board electrical contact.

22. The non-transitory machine-readable storage medium of claim 21, the instructions further causing the computer-controlled device to:

disposing a solder paste between the at least one flexible circuit board electrical contact and a first circuit board contact on the first rigid base circuit board; and reflowing the solder paste to provide an electrical and mechanical connection between the at least one flexible circuit board electrical contact and the first circuit board contact.

* * * * *